(12) United States Patent
Norman

(10) Patent No.: US 10,089,662 B2
(45) Date of Patent: Oct. 2, 2018

(54) MADE-TO-ORDER DIRECT DIGITAL MANUFACTURING ENTERPRISE

(71) Applicant: KRAFTWÜRX, INC., Cypress, TX (US)

(72) Inventor: Bryan C. Norman, Katy, TX (US)

(73) Assignee: KRAFTWÜRX, INC., Cypress, TX (US)

(*) Notice: Subject to any disclaimer, the term of this patent is extended or adjusted under 35 U.S.C. 154(b) by 0 days.

(21) Appl. No.: 15/893,179

(22) Filed: Feb. 9, 2018

(65) Prior Publication Data

US 2018/0165730 A1  Jun. 14, 2018

Related U.S. Application Data

(63) Continuation of application No. 13/374,062, filed on Dec. 9, 2011, which is a continuation of application No. 13/134,581, filed on Jun. 10, 2011, now Pat. No. 8,515,826, which is a continuation-in-part of application No. 11/750,499, filed on May 18, 2007, now abandoned.

(60) Provisional application No. 60/747,601, filed on May 18, 2006.

(51) Int. Cl.
| | |
|---|---|
| *G06Q 30/00* | (2012.01) |
| *G06Q 30/06* | (2012.01) |
| *B33Y 50/00* | (2015.01) |
| *B33Y 80/00* | (2015.01) |

(52) U.S. Cl.
CPC ......... *G06Q 30/06* (2013.01); *G06Q 30/0621* (2013.01); *B33Y 50/00* (2014.12); *B33Y 80/00* (2014.12)

(58) Field of Classification Search
CPC ......... B33Y 10/00; B33Y 30/00; B33Y 80/00; G06Q 30/0621
USPC .................................. 705/26.1, 27.1
See application file for complete search history.

(56) References Cited

U.S. PATENT DOCUMENTS

| | | |
|---|---|---|
| 6,489,957 B1 | 12/2002 | Han et al. |
| 6,985,876 B1 | 1/2006 | Lee |
| 7,159,753 B2 * | 1/2007 | Subrahmanyam ..... B23K 9/095 228/102 |
| 7,656,402 B2 | 2/2010 | Abraham et al. |
| 8,285,678 B2 | 10/2012 | Moore, Jr. et al. |
| 8,583,272 B2 | 11/2013 | Spector |
| 8,762,173 B2 | 6/2014 | Wasson et al. |

(Continued)

OTHER PUBLICATIONS

Tinham, Brian, "Jewel in the crown technology plus craft," Manufacturing Computer Solutions, Apr. 2004, pp. 16-18.

*Primary Examiner* — Brandy A Zukanovich
(74) *Attorney, Agent, or Firm* — Patterson & Sheridan, LLP

(57) ABSTRACT

Methods and systems for designing and producing a three-dimensional object selection of a base three-dimensional object from a customer device. A base three-dimensional model corresponding to the object is displayed on the customer device, and one or more custom modifications are received. A modified three-dimensional model corresponding to the modified object is prepared and displayed. Once confirmation to produce the modified object is received, data corresponding to the modified three-dimensional model is transmitted to a manufacturing device for production of the object, using the data to do so, such that the object corresponds directly to the modified three-dimensional model.

20 Claims, 32 Drawing Sheets

(56) References Cited

U.S. PATENT DOCUMENTS

| | | |
|---|---|---|
| 9,229,674 B2 | 1/2016 | Tapley et al. |
| 9,342,631 B2 | 5/2016 | Mahdavi et al. |
| 9,623,578 B1 | 4/2017 | Aminpour et al. |
| 2002/0032573 A1 | 3/2002 | Williams et al. |
| 2002/0156694 A1 | 10/2002 | Christensen et al. |
| 2002/0161668 A1 | 10/2002 | Lutz et al. |
| 2003/0035138 A1 | 2/2003 | Schilling |
| 2004/0133431 A1 | 7/2004 | Udiljak et al. |
| 2005/0023710 A1 | 2/2005 | Brodkin et al. |
| 2005/0043835 A1 | 2/2005 | Christensen |
| 2005/0133955 A1 | 6/2005 | Christensen |
| 2005/0162689 A1 | 7/2005 | Roztocil |
| 2005/0289018 A1 | 12/2005 | Sullivan et al. |
| 2006/0188145 A1 | 8/2006 | Song et al. |
| 2006/0253214 A1 | 11/2006 | Gross |
| 2007/0156540 A1 | 7/2007 | Koren |
| 2007/0283275 A1 | 12/2007 | Azam |
| 2011/0145100 A1 | 6/2011 | Berger et al. |
| 2011/0282476 A1 | 11/2011 | Hegemier et al. |

\* cited by examiner

FIG. 2

CONSTRAINT DESCRIPTION

Lorem ipsum dolor sit amet, consectetuer adipiscing elit. Nulla rutrum vehicula urna. Cras arcu. Vestibulum porttitor purus at leo. Vivamus aliquet, purus eu porttitor accumsan, purus pede interdum mauris, non laoreet est ante non neque. Cras vel dolor sed ipsum aliquam eleifend. Maecenas sed risus. Morbi cursus purus pellentesque ante. Aenean magna. Vestibulum viverra lacus at odio. Praesent eget elit. Curabitur et justo. In id quam. Donec nibh. Maecenas at ante. Morbi non libero eu eros rhoncus molestie.

search [_____]

Define Constraint

| | |
|---|---|
| Name | Text Field 1 ▼ |
| Type | Bounding Box ▼ |
| Intent | Text Emboss ▼ |
| Suppress Print | NO ▼ |
| Surface Finish | Smooth ▼ |
| Scale Font | Auto ▼ |
| Number Lines | 1-Line Text ▼ |
| Mate Replace | Replace ▼ |
| 3D method | Extrude ▼ |

HELP    SAVE    ( OK )

ADVANCED CONSTRAINT OPTIONS
- Upload 3D object
- API Scripting
- Rendering Options
- Displacement Rules
- Extrude Rules
- Freeform Design Limits

PRODUCT VIEW

CONSTRAINTS
TEXT FIELD 1
DISPLACEMENT MAP 1
DISPLACEMENT MAP 2
STONE
SCHOOL NAME
LOGO
BEZEL TYPE
TOP TYPE

TEST CONFIGURATION ( GO )

CROWDSOURCE? ( GO )
Find someone with a skillset necessary to make your product which you lack.

PUBLISH & SELL YOUR DESIGN ( SELL IT )

FIG. 9

MADE-TO-ORDER DIRECT DIGITAL MANUFACTURING ENTERPRISE

CROSS REFERENCE TO RELATED APPLICATIONS

The present application is a continuation application of U.S. Ser. No. 13/374,062, filed Dec. 9, 2011, which claims priority to U.S. Ser. No. 13/134,581, filed Jun. 10, 2011, which claims priority to U.S. Ser. No. 11/750,499, filed May 18, 2007, which in turn claims priority to the U.S. Provisional Ser. No. 60/747,601, filed May 18, 2006. Each of the above-referenced applications is incorporated by reference herein in their entirety.

FIELD OF THE INVENTION

The present invention relates to the design, sale and manufacture of made-to-order or mass-customized products. More specifically to a computer-based method and system for customer-driven design, sale and manufacturing of unique or custom-made product(s) exclusively through a highly efficient sales & manufacturing system which advantageously combines key elements of computer aided design methodologies, the internet and Additive Fabrication methodologies to personalize or customize said products.

BACKGROUND OF THE INVENTION

The customization of durable goods products is a desirable characteristic that many retail markets would enjoy being able to broadly utilize and many consumers would enjoy broadening their product selection and bringing what they buy closer to what they want. Unfortunately sales, distribution and manufacturing systems designed to deliver mass-manufactured goods to consumers and or job-shops that do custom manufacturing are not positioned to effectively deliver mass-customization, generally placing custom-designed products out of the reach of consumers. Additionally, the machines, methods and labor are ineffective at delivering customization cost-effectively. An example is the manufacture of class rings or other jewelry. The diversity of these products is defined by the selection of molds and tooling used to inject wax which is used to cast the final product. A manufacturer cannot provide an infinite product selection or face the challenge of also producing and storing an infinite number of molds and tooling parts.

The customization characteristics desired by individuals are diverse and therefore, the method is applicable to a wide array of products. For example; a customer may desire a custom-designed broach or ring that contains a 3D representation of a family crest or insignia. To obtain this custom product requires specialized training including 3D CAD modeling and design experience or at the very least CNC programming experience. Other customizable products might include custom valve covers for a hotrod. Designing these products and having them manufactured by CNC machining would be expensive and, the equipment necessary is not normally available to the general public nor are the operating procedures of the equipment. Therefore; customization options for consumers are often limited and access to customization of products is difficult. The result is that individual needs and or desires are not always met and customers therefore settle for less than what they wanted or desired.

Computer-based networks, access systems, websites, databases, processing speeds and 3D geometry manipulation have reached a sufficient level of performance to provide consumers with the ability to drive changes to products themselves in many aspects. Consumer capabilities to understand such systems have also reached a level sufficient for consumers to realistically be involved in at least some aspects of a design process, for example those that do not cause risk to a customer or liability to a manufacturer as defined by constraints preventing a customer from violating the constraints during design for personalization or customization.

Computer-based geospatial/3D design & design implementation systems are based on point-of-use deployment models. Such systems are also intended for use by someone skilled in the art of CAD/CAM and design methodologies. This effectively means that manipulation of the geospatial/3D geometries commonly called CAD models requires advanced knowledge and significant time to develop. When properties such as structural integrity or thermal properties are involved, even basic design skills for 3D move out of the realm of consumers with basic skills in this area, often to an advanced engineer-level which is beyond the comprehension of the general public. CAD systems are also precise and unforgiving in many aspects of their use. Some examples of 3D design tools include Autodesk Inventor, Solidworks, Unigraphics, CATIA, Mechanical Desktop, MAYA, Rhino 3D, 3D Studio Max and more.

Computer-based 3D design and design implementation systems are required to produce a product by additive fabrication methods. Such systems are costly and must be purchased by a user and added to the user's computer. The user must also learn how to use the system, the engineering behind designing a product and finally, locate a facility to produce the product. Also, designing a product from scratch is time consuming, even for someone skilled in the art of CAD/CAM design, engineering and manufacturing.

Rapid Prototyping and Additive Freeform Fabrication are used interchangeably to describe technologies that have been developed to create or "manifest" 3D objects representative of computer-based geospatial/3D geometry through the process of depositing materials in an additive or layered process, resulting in a net or near-net shaped product conforming to the dimensions of the 3D computer-based geometry upon which such an object is based without tooling or molds or much of the labor required in traditional subtractive methods of manufacture. At present there are approximately 25 additive fabrication processes covered by various patents. Each technology has inherent limitations and benefits including the feature resolution, materials that the technology can use, speed, surface finish and a plethora of other parameters by which a part can be measured however; the deployment model of such technology is, for the most part, considered for prototyping and not for direct digital manufacturing. For example; a wax polymer is ideal for the manufacture, by lost wax investment casting, of custom jewelry. Solid-Scape additive fabrication technology is ideally suited for the manufacture of jewelry. Solid-Scape hardware is capable of printing or manifesting, at high resolution in a relatively small build envelope. Other technologies, such as Selective Laser Sintering from EQS are suited for the manufacture of larger components made from nylon materials or a limited selection of metals however the surface finish of the SLS process is considered rough when compared to other processes.

Current deployment methodologies in use for both CAD/CAM systems and additive fabrication technologies limit the widespread use of the aforementioned technologies. For example, manufacturing more than a small lot of products on any given machine in a reasonable timeframe is thwarted by throughput. However, if machines in one location were linked to machines in multiple distributed locations, the effective capacity would be greatly increased. The net result of these differences is that all of the various additive fabrication processes may be required to provide the net result of a finished product consistent with expectations for a particular product.

Since it is prohibitive for any one facility to own every machine of every type from every manufacturer, it is advantageous to link many facilities together, further realizing the full potential of additive fabrications.

Computer-based implementations of Product Lifecycle Management (PLM), Product Data Management (PDM), Master Production Scheduling, part routing and part nesting systems are capable of intelligent and automated actions to manage decisions for operations in a production capacity and planning system and can include other intelligent decision-making abilities such as procurement and inventory management but they are designed to move "real" products, not virtual products through the system.

It is therefore beneficial to effectively combine additive fabrication, Computer Aided Design methods, capacity planning and the Internet with automated PDM!PLM production scheduling and routing systems in a manner that enable deployment of additive fabrication methods and technologies as an Enterprise Resource Planning (ERP) production system. As such, embodiments of the present invention advantageously create a disruptively competitive and efficient system for the design, sale and manufacture of individualized or customized products by synergistically combining facets of many technologies into a more productive method and tool.

SUMMARY OF THE INVENTION

In light of the preceding background, embodiments of the present invention provide methods and systems for user/customer selection, design, sale and manufacture of customized/personalized products through a streamlined and/or automated or semi-automated process combining computers, the internet, 3D modeling (also called CAD modeling), a customization interface including an interactive controls suite connected to the 3D modeling system for the purpose of allowing a user/customer to personalize or customize a product represented by a 3D geometry or multiple 3D geometries, whereby the user/customer is connected to the Cad modeling system through a website or web portal along with a 3D viewer connected to the 3D CAD geometry manipulation system for the purpose of providing design feedback and pre-purchase visualization to said user/customer accessing the system through said website or web portal, whereby said product is manifested in an automated or semi-automated fashion via additive fabrication methodologies. Embodiments of the present invention improve operational performance in a design, sale and manufacturing system to design, manufacture and sell a wide variety of products which can be adequately defined by one or more computer-based design and design implementation methods to 3D geometry manipulation where said geometry can be properly manifested by any additive fabrication technique.

According to one embodiment of the present invention, the method is carried out by a computer-based system which includes at a minimum; a computer, a software-based geospatial/3D modeling engine (a CAD engine), input/output controls to the 3D modeling engine, a 3D viewer engine, a database or file system and a production routing and scheduling system interconnected with additive fabrication hardware.

Embodiments of the invention are designed to interface a customer directly with the digital representation of their intended physical manifestation, thereafter referred to as a product. In essence, the customer is peering through an internet "portal" at the customer's unique product and can interact with it during the design process. Any changes made by the user of the system that occur to the product become unique facets of the particular product the user/customer is building or creating for purchase. Embodiments of the system are capable of interfacing with a plurality of customers simultaneously and are designed to do so.

Another embodiment of the invention can automate most, and in some cases all, of the post-sale production operation, thereby removing most, if not all, of the human factor requirements from the system and thereby removing or minimizing the number of people involved within production environment, further optimizing the manufacturing process, maximizing productivity and minimizing labor needs.

Advantageously, embodiments of the system are conceived to be capable of assembling and modifying 3D components of a customer's unique product in increments measured in milliseconds while the product exists as a mathematically-derived 3D model or models. This is many orders of magnitude faster than any other known production system available today.

Embodiments of the method and system can utilize additive fabrication for manifestation of a unique product or component(s) of a product, thereby making the systems' inventory highly flexible. Embodiments of the system are designed to use the full gamut of available Additive Freeform Fabrication technologies collectively making possible production of products with diverse materials. Since embodiments methods and systems are developed around the concept of 3D geometry and CAD modeling, the methods described herein can include future Additive Freeform Fabrication technologies as the intended output technique inasmuch as the additive fabrication technique relies on 3D data as the basis for output through the additive methodology.

Furthermore, embodiments of the present system provide a completely flexible and scalable production operation. Deployment models may include an "in-house" model where all additive fabrication hardware resides in a single facility or at multiple facilities including diverse and/or divergent locations. Capacity within a locally deployed system can be expanded by purchasing additional Additive Freeform Fabrication hardware and adding it to the system or by taking advantage of distributed networking, the internet and available additive fabrication hardware available at other facilities. These facilities may include bureaus or other manufacturers using one or more embodiments of the present system(s).

Furthermore, embodiments of the present invention may make use of multiple types of additive fabrication hardware simultaneously or concurrently to manifest a plurality of components of an assembly for a product that is, by design or by desire, necessary to be made of different materials and assembled from the various components. The system in this situation would be responsible for routing components that must be manifested out of differing materials to several or many local or remote locations for fabrication via additive fabrication processes that support fabrication of the desired or required material substance. Examples of this material might include metals of varying natures, plastics or polymers of varying nature, waxes or even composites or slurries. Such varying needs can require use of the entire gamut of Additive Freeform Fabrication hardware.

In another embodiment, the method and system can be accessed by a user/customer via one or more communication methods whereby the user/customer accesses the system over the communication network, the method providing the user a plurality of product selections to said user/customer back through the communication method, receiving from said user/customer via the communication method a selection of a product or products, and providing said user a customization/personalization interface, the customization/personalization interface providing at least one personalization/customization tool or option to said user/customer to create an individually customized product and whereby said customization/personalization option does not violate any parameter prevention its manifestation through Additive Fabrication methodologies.

Wherein the summary of the invention provided, including certain aspects, advantages and novelty of the invention have been described herein. It is thoroughly understood to one skilled in the art, that not necessarily all such advantages may be achieved in accordance with any particular embodiment of the invention. Thus; the invention may potentially be carried out in one or more manners that optimize one or more advantages as described herein without achieving other advantages as descried herein.

These and other embodiments of the present invention shall become apparent to anyone skilled in the art whom review the detailed description of the embodiments herein including but not limited to figures, features, or other descriptions disclosed.

DESCRIPTION OF RELATED ART

Software applications for CAD modeling exemplified by those from Solidworks Corporation and Autodesk, Inc., include tools designed to provide for mechanical deformation and or mechanical assembly of a plurality of individual 3D parts to create an "assembly" where each discrete component is represented in the assembly as a 3D model and therefore the assembly is also a 3D model. The purpose of said software is mechanical design and design validation. Said software was intended to be utilized for the purpose of design and design validation by a designer or more specifically a design engineer who is someone that understands the intricacies of mechanical fit and function.

Manipulating a single file that is part of an assembly in Solidworks, Inventor and other mechanical design software can impact an assembly of parts and therefore the assembly will also reflect the modifications including feedback on collisions of parts and an inability for the combination to exist physically. Solidworks U.S. Pat. No. 6,308,144 encompasses some of the concepts of moving and or repositioning objects in an electronic manner representative of mechanical assembly of physical products. Autodesk also has a similar assembly method within their software that electronically "bonds" 3D objects in the computer in a manner similar to Solidworks. Such is the nature of mechanical design software, to validate and help drive accurate and meaningful reduction in design cycle times by allowing an engineer to design the product virtually. Without this assembly methodology, the design and analysis would not be possible.

All 3D design and modeling software is built on a commercially available 3D CAD engine. The most popular 3D CAD engine today is made by Parasolid and embodied in U.S. Pat. No. 6,489,957; "Three dimensional geometric modeling system with multiple concurrent geometric engines". Other 3D CAD engines exist such as an older system called ASIS. Other CAD systems exist. Most products including Parasolid are available commercially for purchase and licensing, just as they are to Solidworks.

3D viewer technology exists in a plethora of formats including the most popular format, Open GL. 3D viewers exist and render 3D geometries represented by mathematics on a computer screen, often seen at CAD workstations, in video games or other graphics applications for the purpose of providing the design engineer or artist the ability to see feedback of a 3D model on their design choices iteratively. 3D rendering and viewer engines are also used on the internet to provide, interactive catalogues of 3D models that a user can download and then use in their own designs or modify mechanically via software including Solidworks. These systems are used to provide only CAD models that are used by design engineers.

Solidworks 3D parts Stream is an interactive catalogue. It is a supplemental application of the Solidworks product which utilizes API-calls to the Solidworks software application to cause the software to manipulate geometry and deliver the results through a visualization system of products through a networked or internet-based system. The intended use of this system is to create 3D models that can then be downloaded and embedded in 3D designs during product design and validation processes as a time-saving tool. Furthermore, the 3D parts Stream product relies on the Solidworks software which in and of itself has limited or rigid functionality such as a very rudimentary ability to manipulate textual information. Furthermore; the output of the Solidworks application terminates as a 3D model which can then be embedded into a product development design. The product and process is intended as a time-saving apparatus for product design and validation. This is analogous to providing a way so that the design engineer does not have to re-draw a washer or castor or screw or some other part every time they need such a part for a new product they are designing. Solidworks brochure for the product states; "A 3D-powered catalog that allows components to be quickly downloaded and "designed in" offers greater convenience for the product designer." Thus is the scope of the 3D parts Stream intended use.

Rapid Prototyping or Additive Freeform Fabrication hardware of many types exist and are used today to provide prototype and limited-production output of 3D models to be used in visualization and low-cost, high-accuracy sample production during the design process, hence the name Rapid Prototyping. To date, some companies are also utilizing Rapid Prototyping or Additive Freeform Fabrication hardware for limited production of products intended for functional end use directly from, or with minimal post processing, directly from the product manifestation via Additive Freeform Fabrication.

Available CAD systems for purchase today are either mechanical design in nature or artistic in nature. Both systems have their merits and both systems have their drawbacks. Mechanical systems lack many of the aesthetic or Industrial Design elements of product design and manipulation software. Industrial Design or artistic software lacks the exacting controls necessary to define a mechanical system. Neither system is developed nor intended to be accessed and driven by a typical consumer wherein the consumer is one not skilled in the art of 3D design. The limitations of mechanical design systems extend to text information, fonts, complex or ergonomic or aesthetically please design elements.

Furthermore the systems and methods described as prior art above are not known to be combined in any manner or similar nature for the purpose or spirit of use as a complete manufacturing enterprise system in any resemblance of the method described herein, a Made-To-Order Digital Manufacturing Enterprise System which; combines one or more computer based design or design implementation methods (CAD/CAM) systems, the internet, websites, or web portals, e-commerce systems, Product Data management, product lifecycle management, master production scheduling, routing & nesting systems into a consolidated system designed exclusively for customer-driven design or design modification to geospatial/3D files which represent the final product.

U.S. Pat. No. 7,216,092 Weber, Et Al embodies a patent related to mass-customization of products in a vague similarity as the patent embodied herein however; the primary differentiator is that U.S. Pat. No. 7,216,092 is obviously, to one skilled in the art, intended for 2-dimensional printed merchandise and not geospatial/3D products. Furthermore, U.S. Pat. No. 7,216,092 embodies at least some techniques and concepts already in practice, for example, www.vistaprint.com has been using a website-based user/customer driven design system for approximately 7 years in customer-driven design and manufacture of custom printed business cards and stationary including; a database for storing and retrieving designs created by a customer through the system. Furthermore; U.S. Pat. No. 7,216,092 discloses a purpose for design by an individual and not a collaborative group.

There is no known prior art combining the methods and systems described herein including; geospatial/3D CAD/CAM data, presented to a user/customer, whereby the actual geospatial/3D geometry presented to the customer is used for purchase intent, including modification or customization for the purpose of modifying to suit individual tastes or preferences is done so through the website or web portal with the intent is purchase by the user who is considered to also be a user/customer and the product is produced in an automated or semi-automated production method including scheduling, routing and automation or semi-automatic manifestation of said part or assembly via Additive Freeform Fabrication where the output of the Additive Fabrication process or processes is considered the final product or where parts together, produced by Additive Fabrication methods collectively comprise a product for purchase through such a system.

Finally, there is no know practiced application of said method or system registered or in use through the internet by consumers which shows prior art as described herein.

BRIEF DESCRIPTION OF THE DRAWINGS

Figure 1:
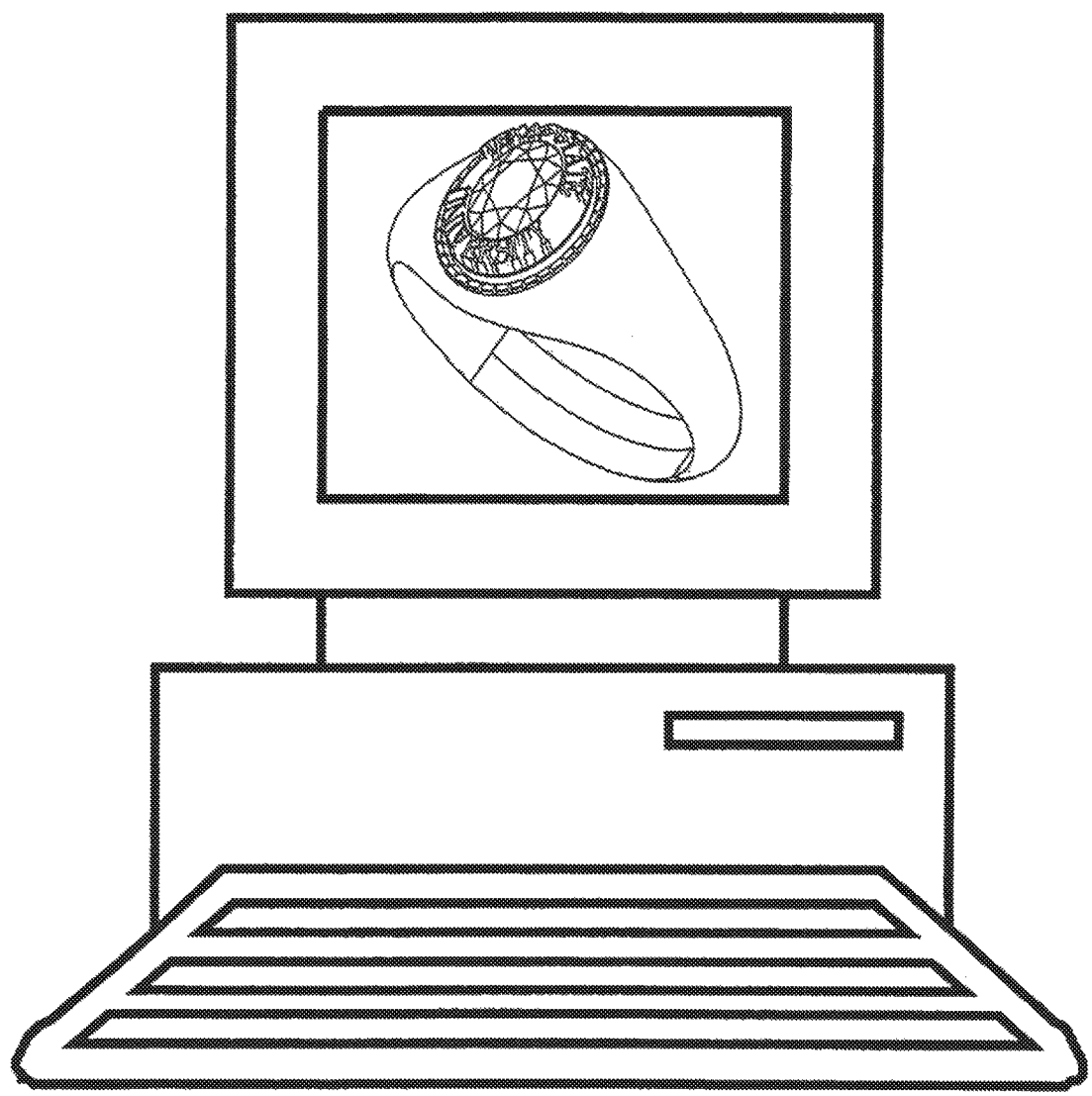

Having thus described the invention in general terms, reference will now be made to the accompanying drawings by example where the drawings are intended to illustrate and not limit the invention wherein;

FIG. 1 depicts the creation of a geospatial/3D CAD model representing a product is established within a CAD system.

Figure 2:
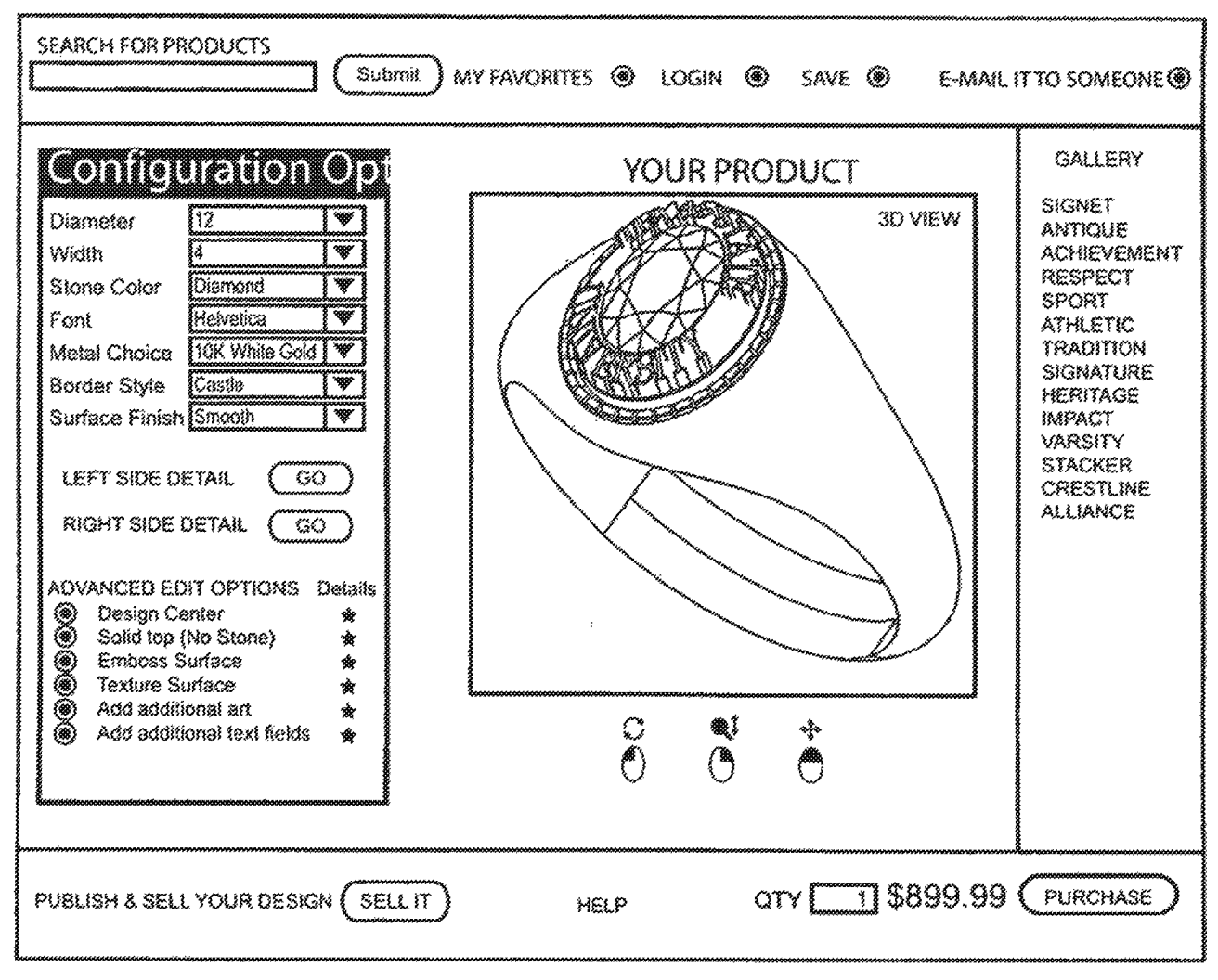

FIG. 2 depicts a website or web portal as part of the method and system for user/customer-driven selection, design, purchase and manufacture.

Figure 3:
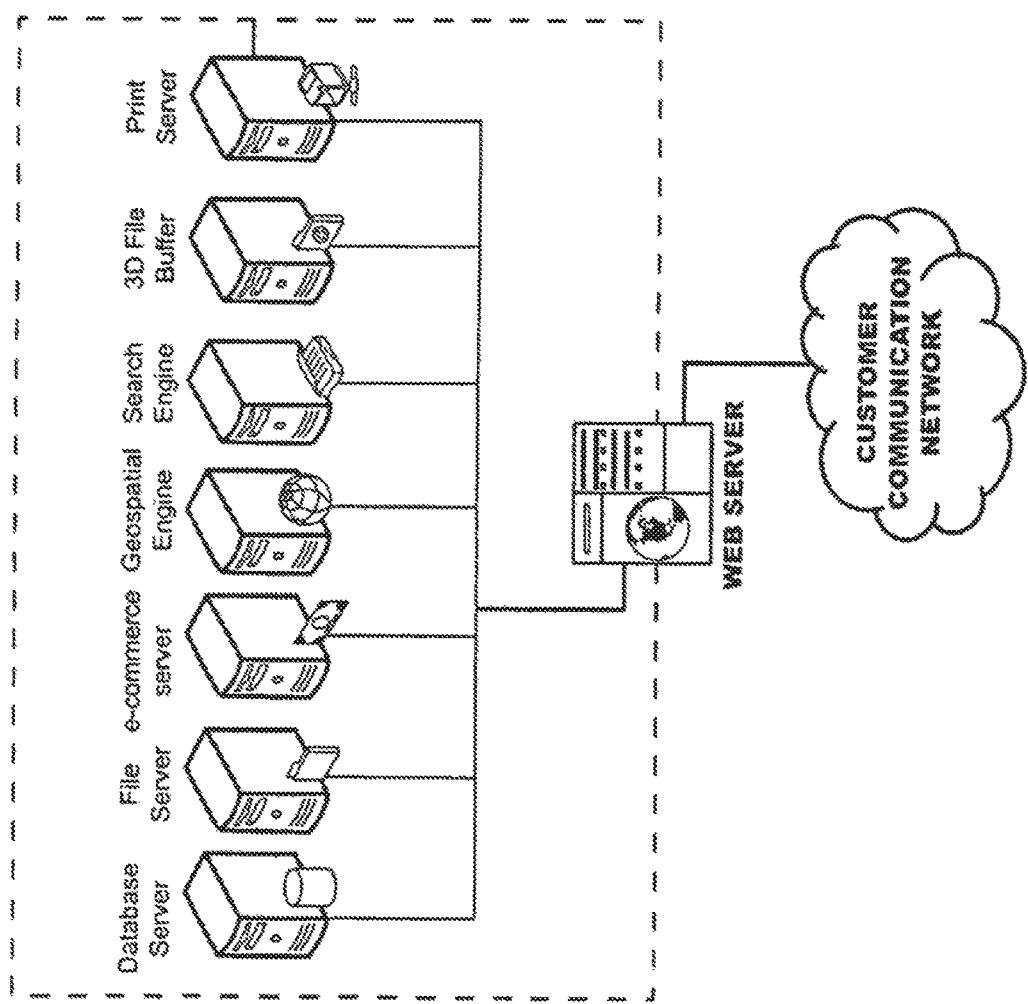

FIG. 3 depicts the computer-based system carrying out a preferred embodiment of the present method.

Figure 4:
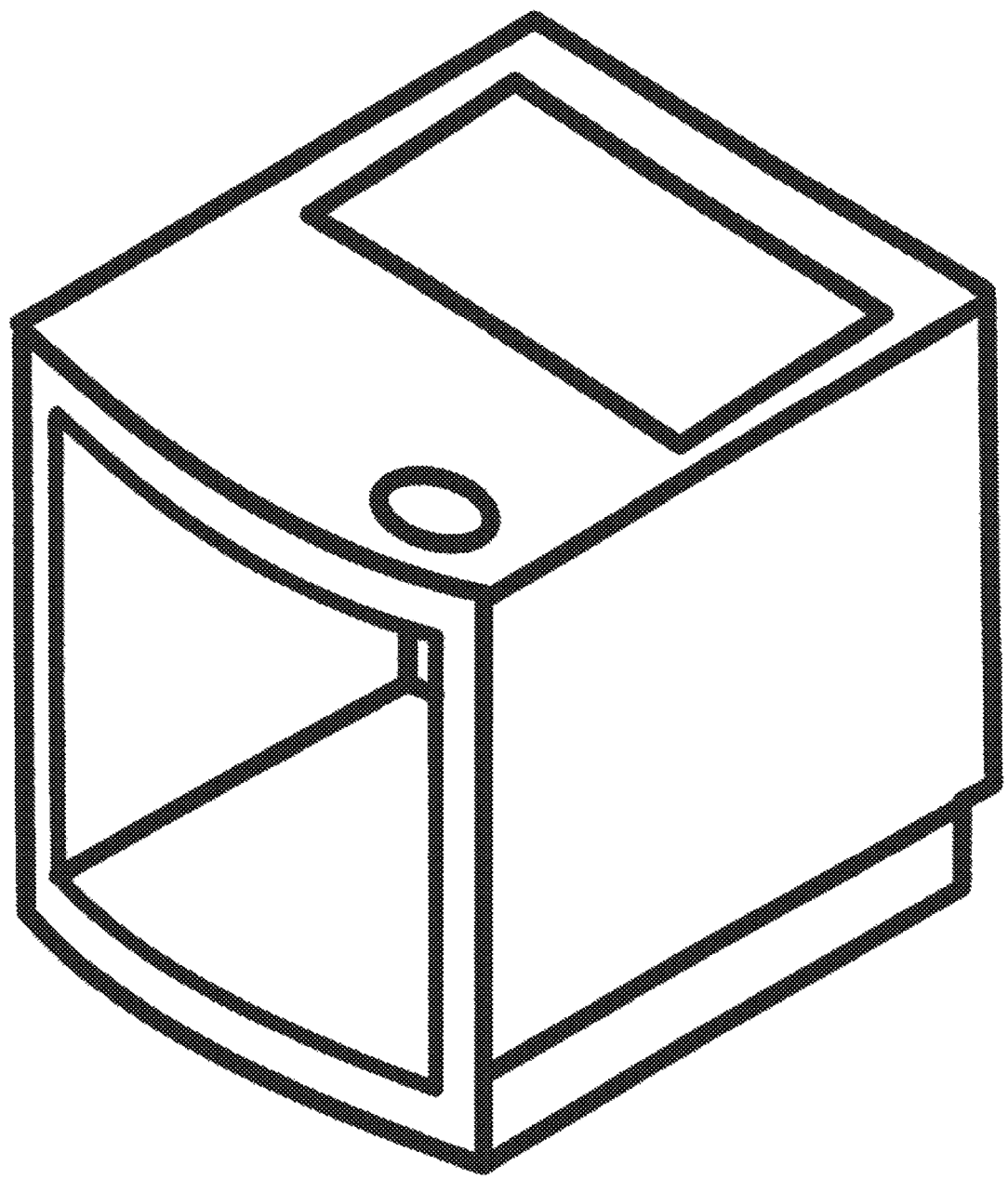

FIG. 4 depicts an additive fabrication machine or 3D printer.

Figure 5:
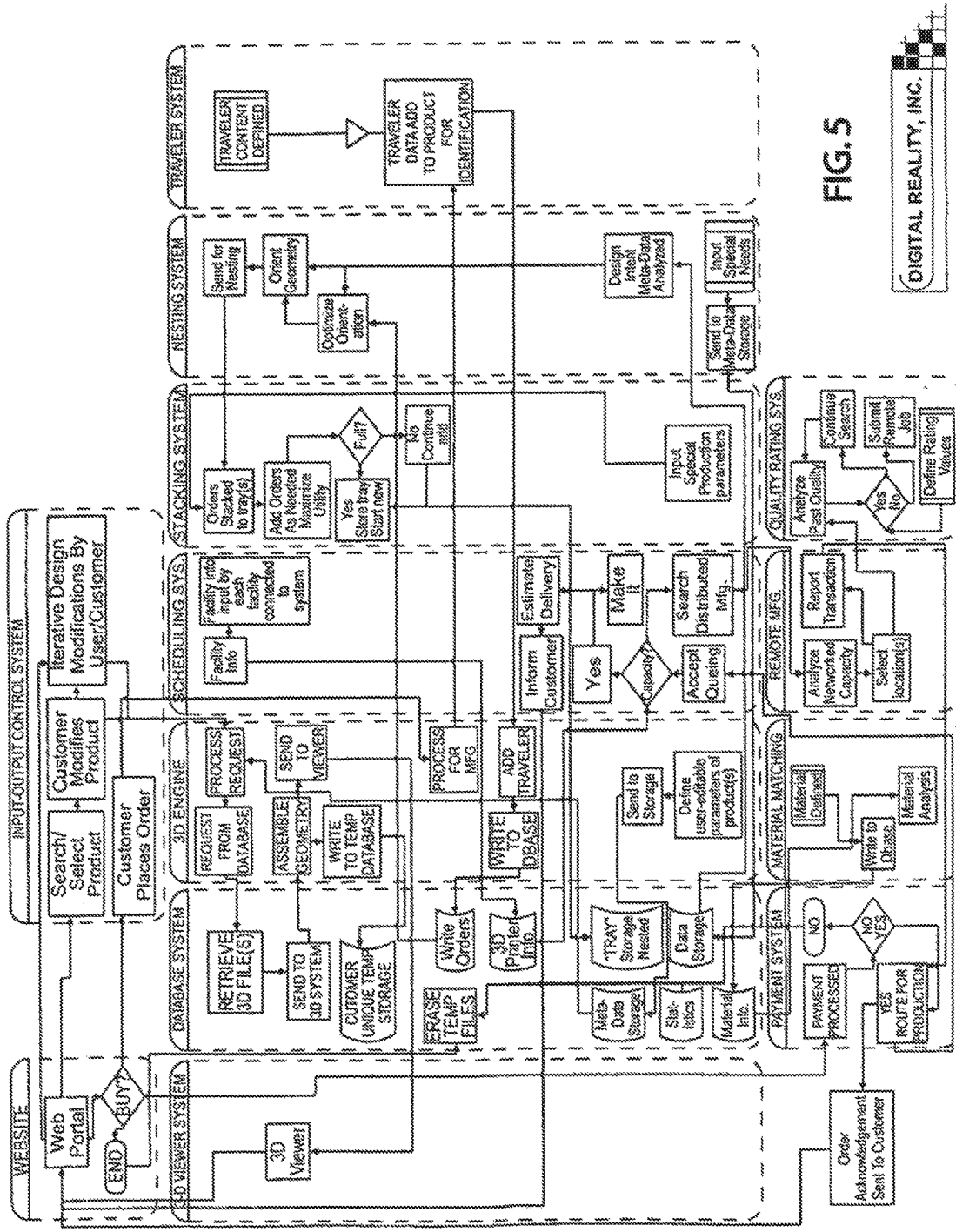

FIG. 5 is a flow diagram depicting an embodiment of the present method.

Figure 5A:

FIG. 5A depicts an embodiment of a method for using a web portal or website system.

Figure 5B:
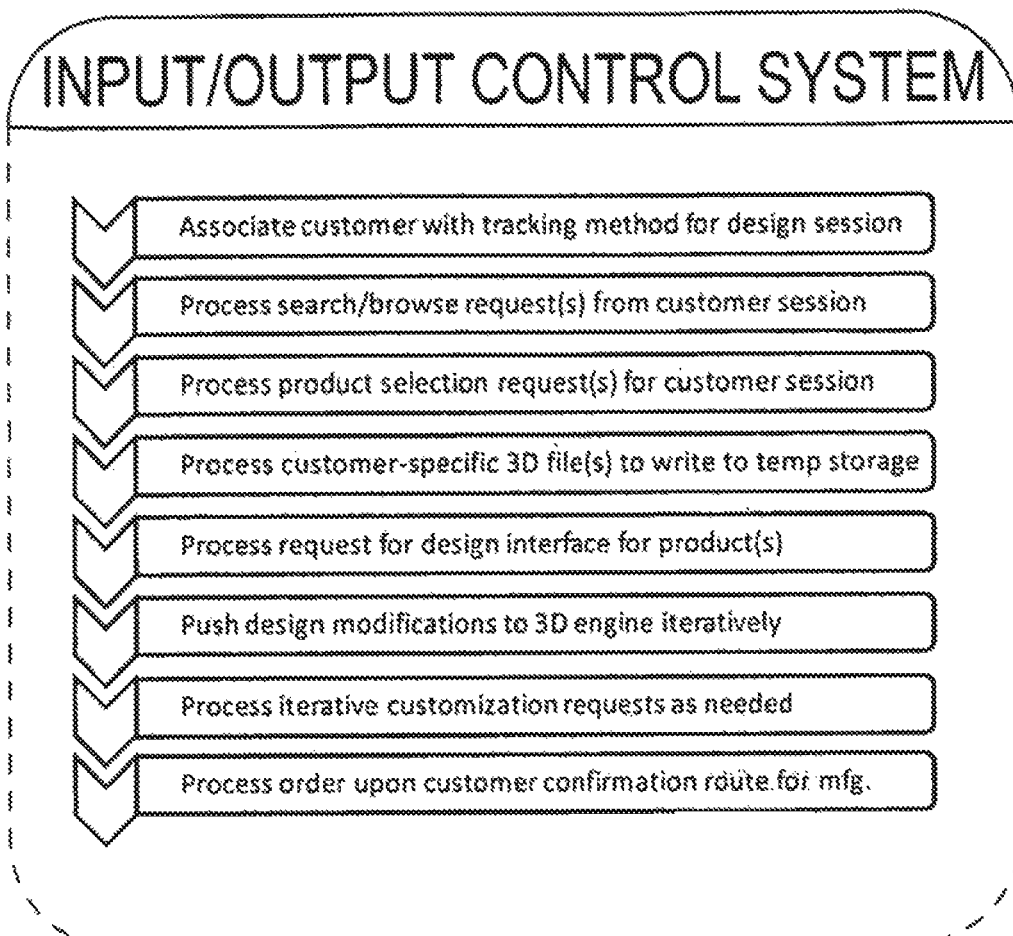

FIG. 5B depicts an embodiment of a method for using the interface providing user/customers the ability to interact with and drive iterative design changes to their product into a 3D engine.

Figure 5C:
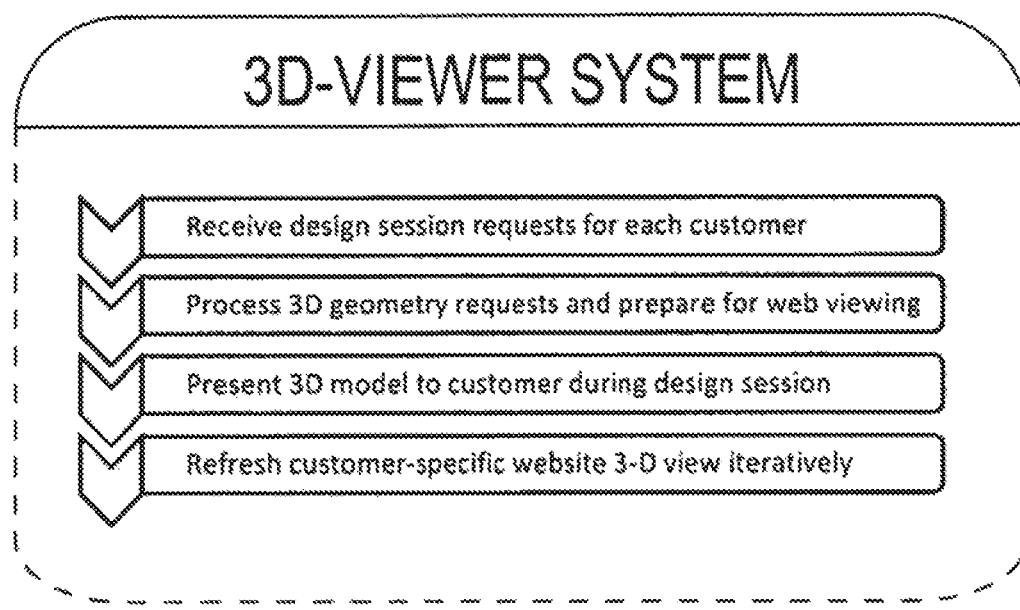

FIG. 5C depicts an embodiment of a method for using a 3D viewer or rendering engine.

Figure 5D:
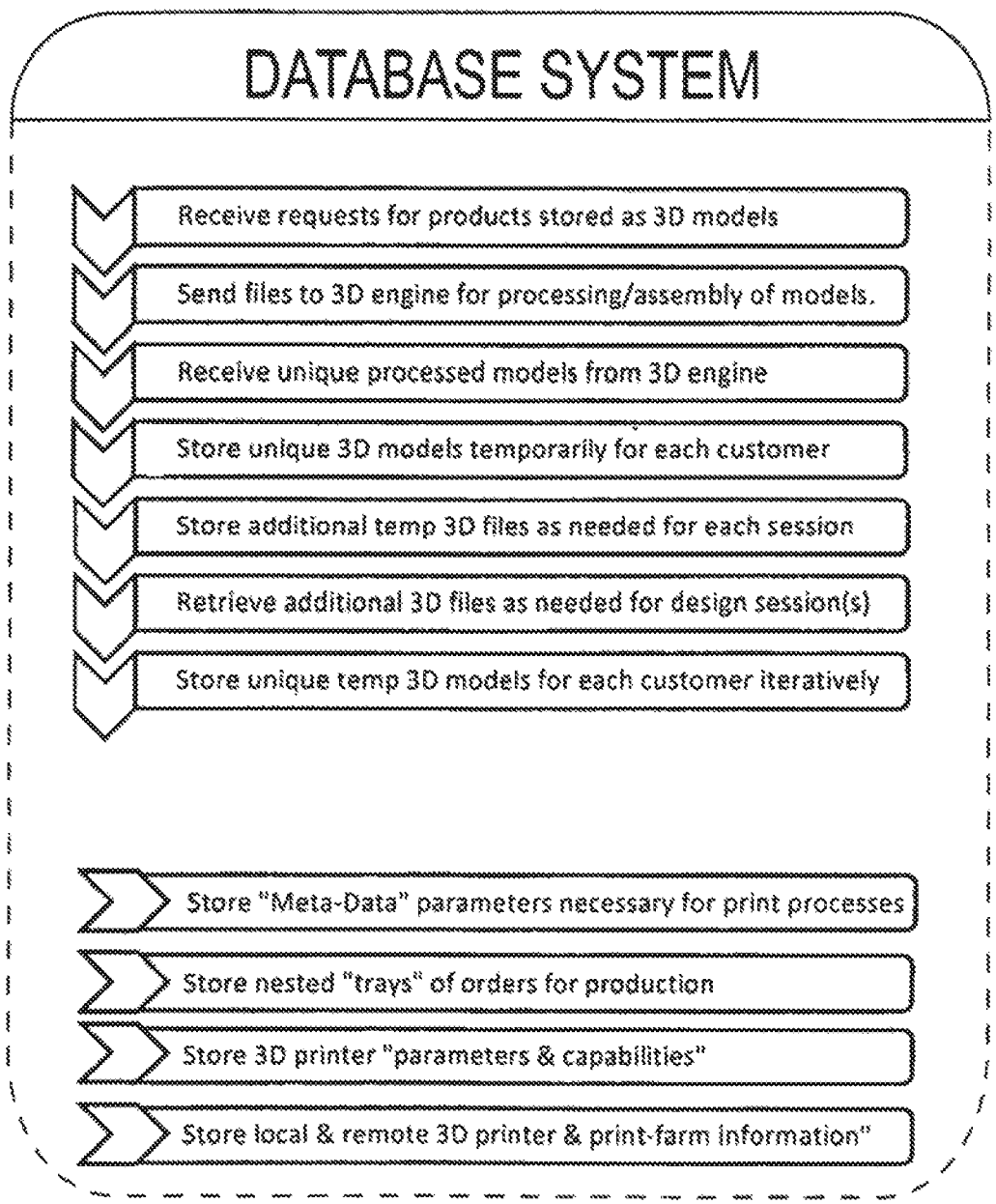

FIG. 5D depicts an embodiment of a method for using database(s) and/or file system(s) responsible for storing product models, product data, temporary files, metadata or other data usable to carry out embodiments of the method of the present invention.

Figure 5E:
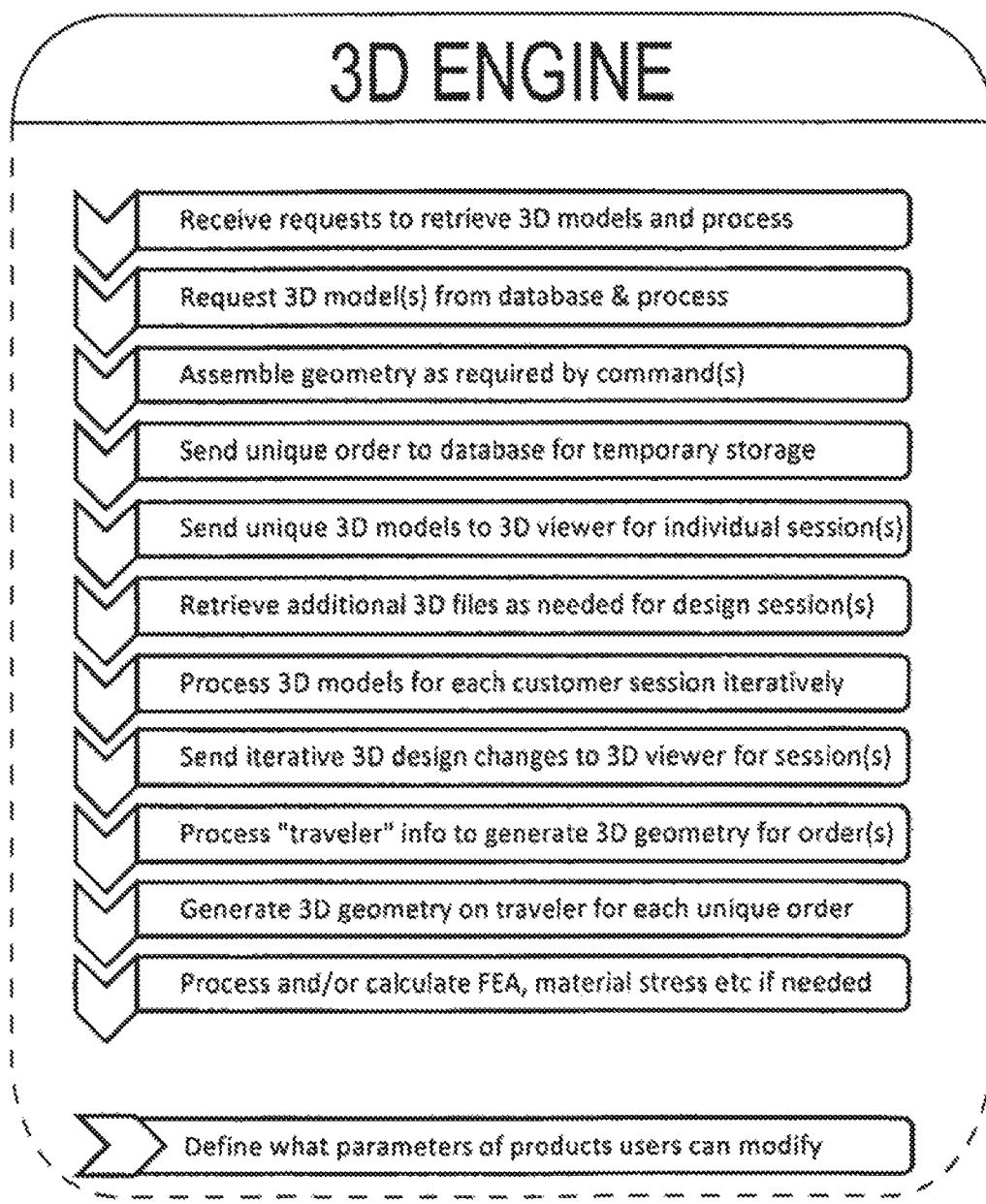

FIG. 5E depicts an embodiment of a method for using one or more 3D modeling or CAD engines that are responsible for manipulating the 3D data according to inputs by a customer through the relational control system depicted in FIG. 5B and connected to the customer via the 3D viewer system depicted in FIG. 5C and ultimately viewed through the Web Portal depicted in FIG. 5A.

Figure 5F:
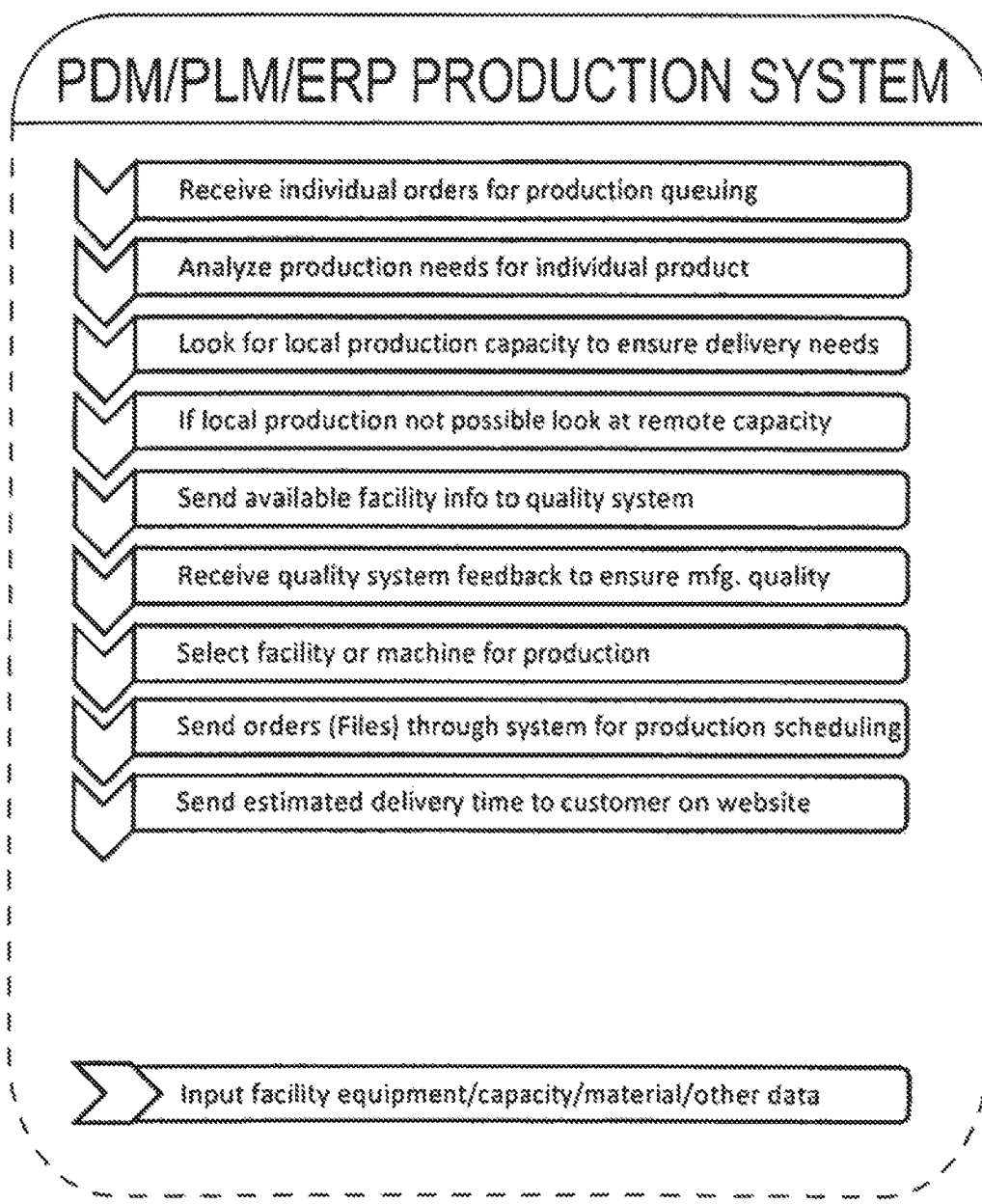

FIG. 5F depicts an embodiment of a method for using a PDM/PLM/master production scheduling system responsible for managing an automated or semi-automated production process.

Figure 5G:
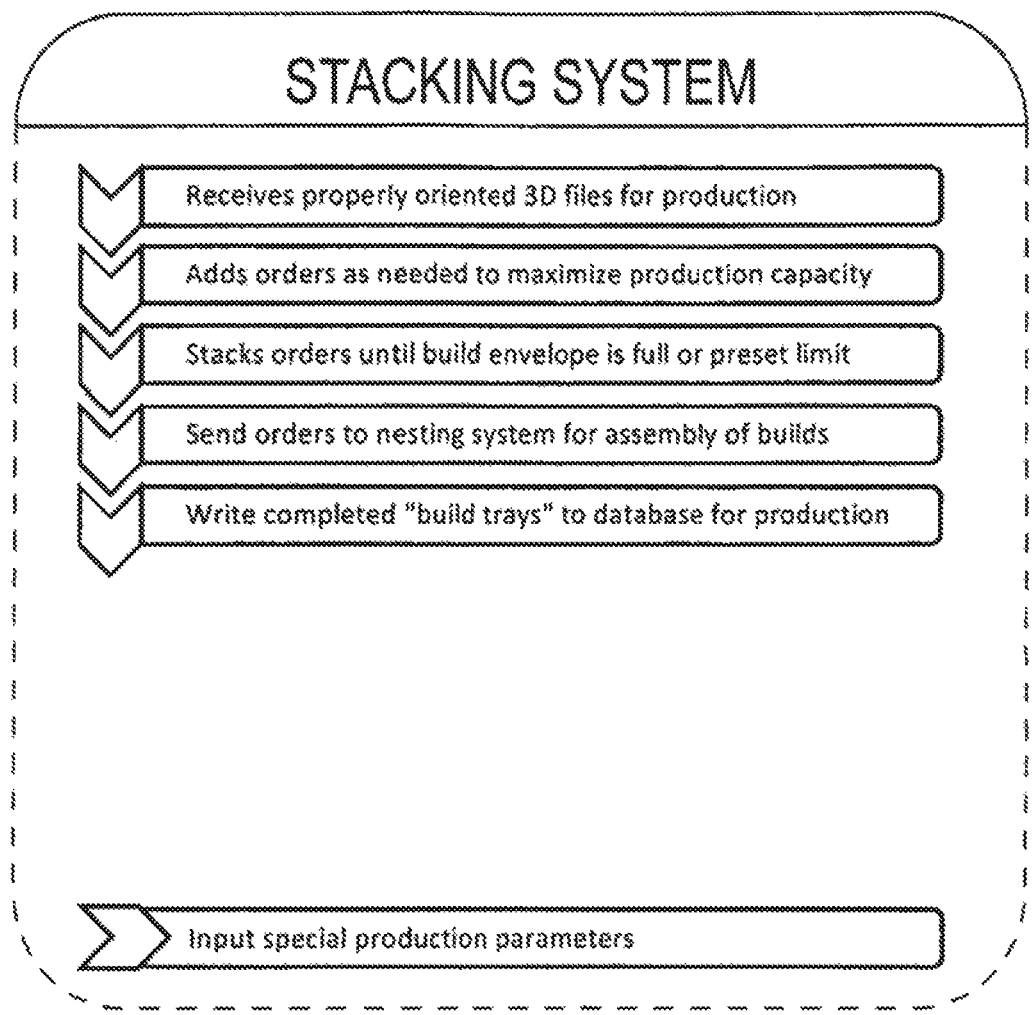

FIG. 5G illustrates an embodiment of a method for using a product stacking system.

Figure 5H:
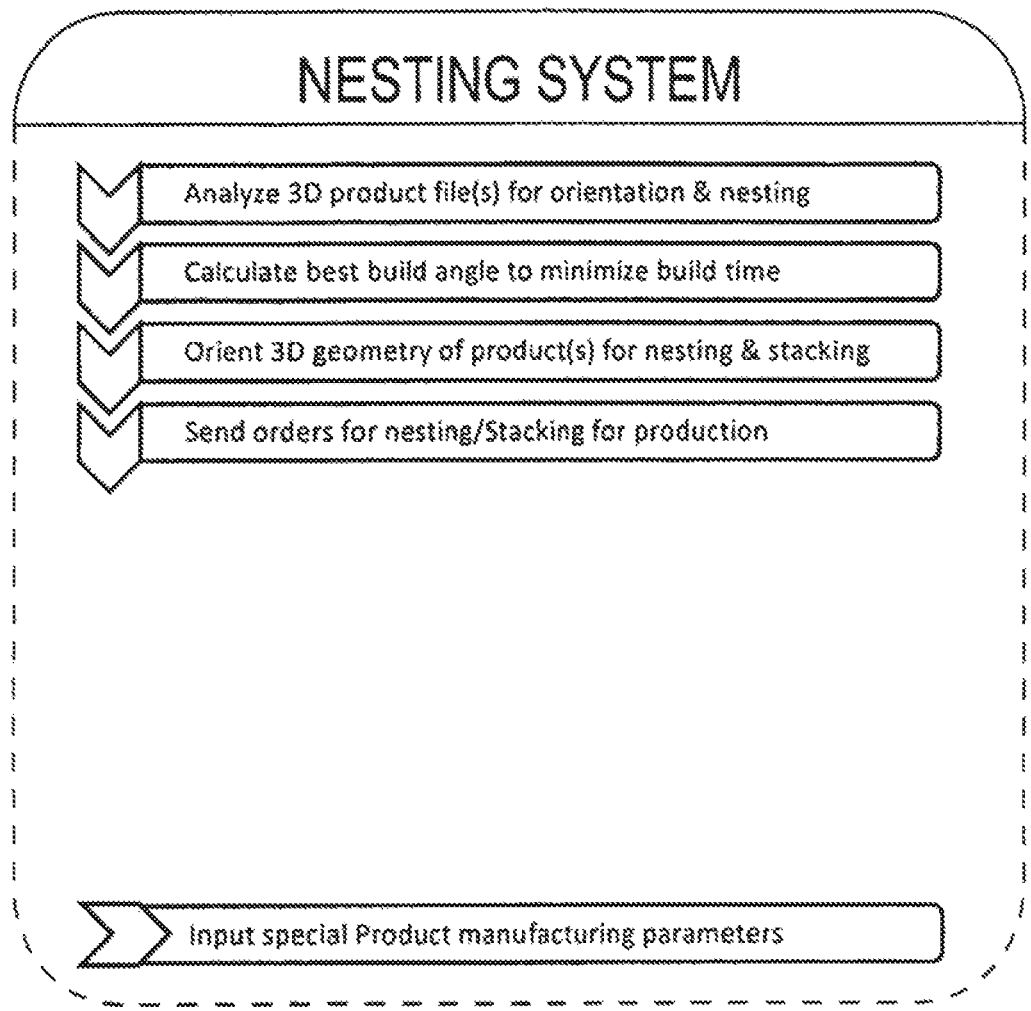
Figure 51:
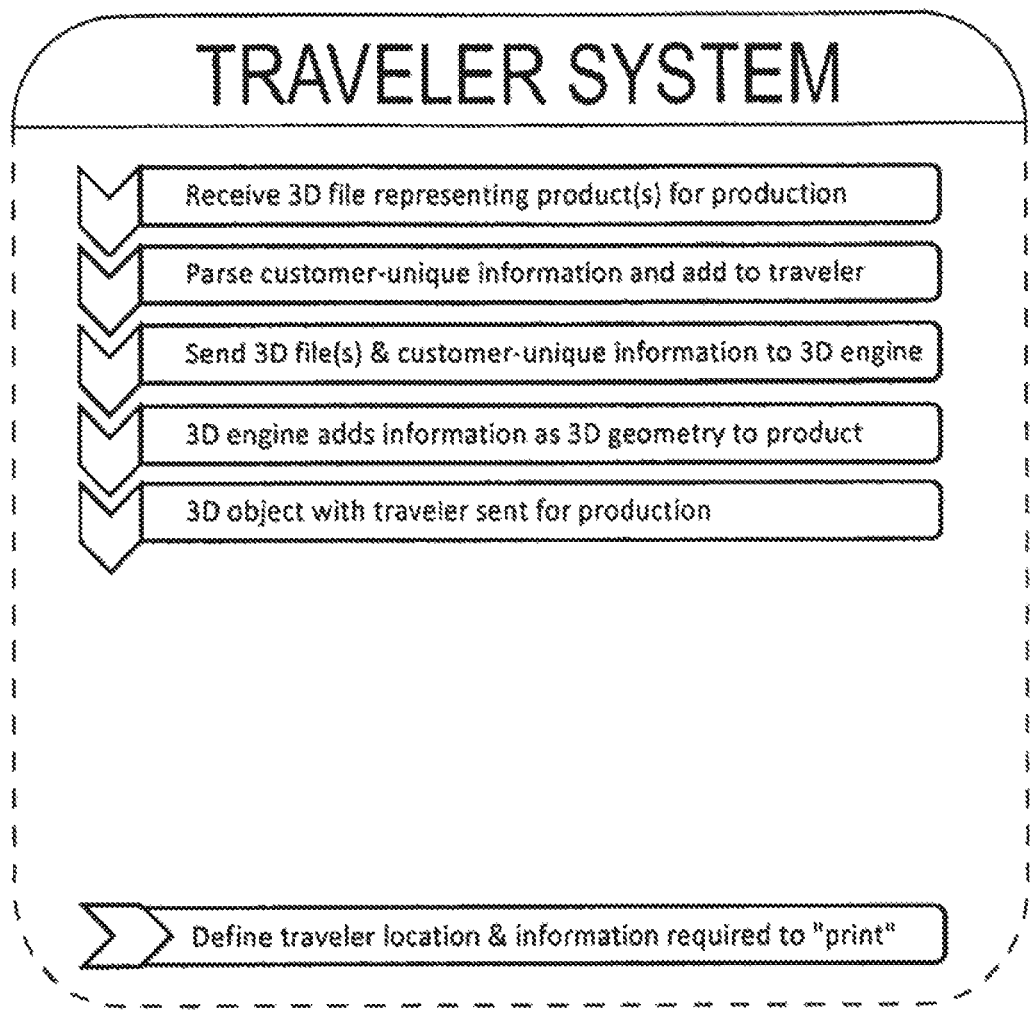

FIG. 5H illustrates an embodiment of a method for using a part nesting system.

FIG. 5I illustrates an embodiment of a method for the addition of identification markings on a product represented by 3D geometry.

Figure 5J:
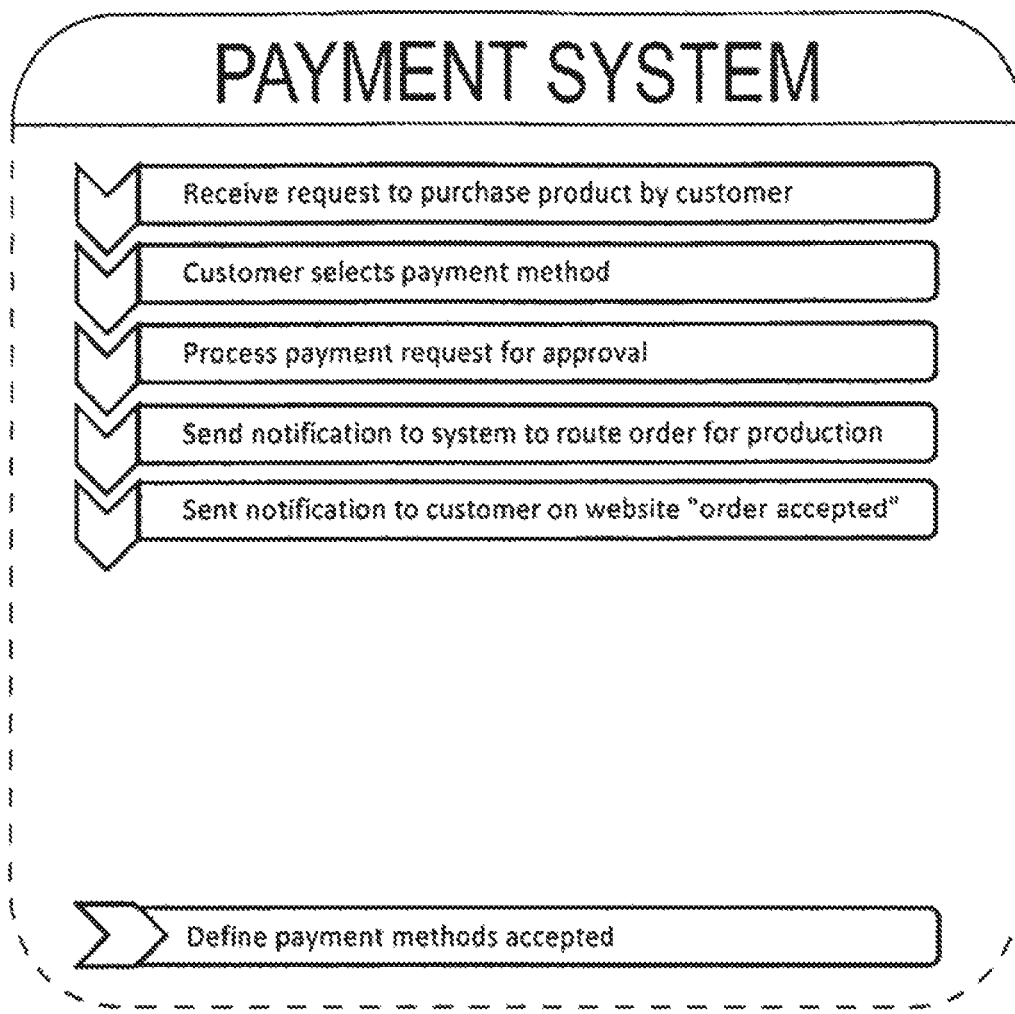

FIG. 5J illustrates an embodiment of a method for using payment processing system.

Figure 5K:
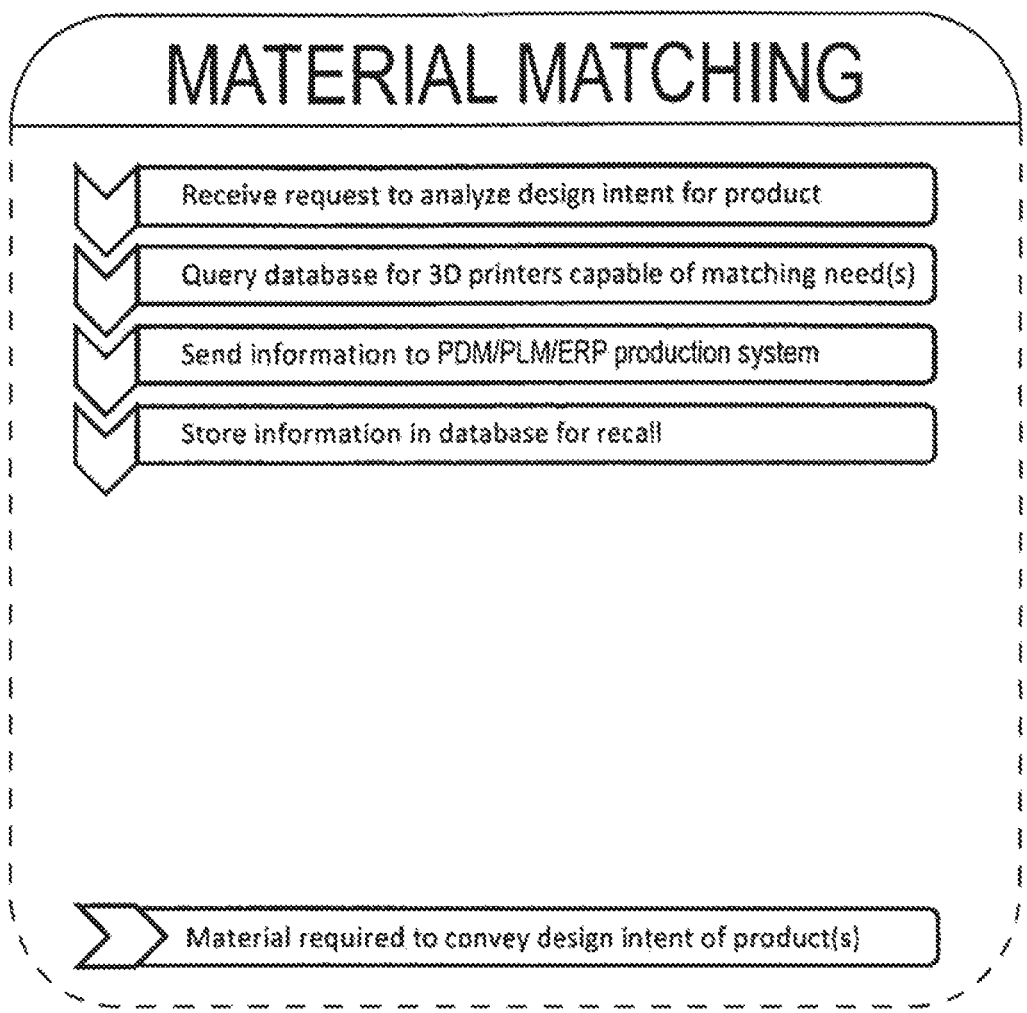

FIG. 5K illustrates an embodiment of a method for using an intelligent material selection system.

Figure 5L:
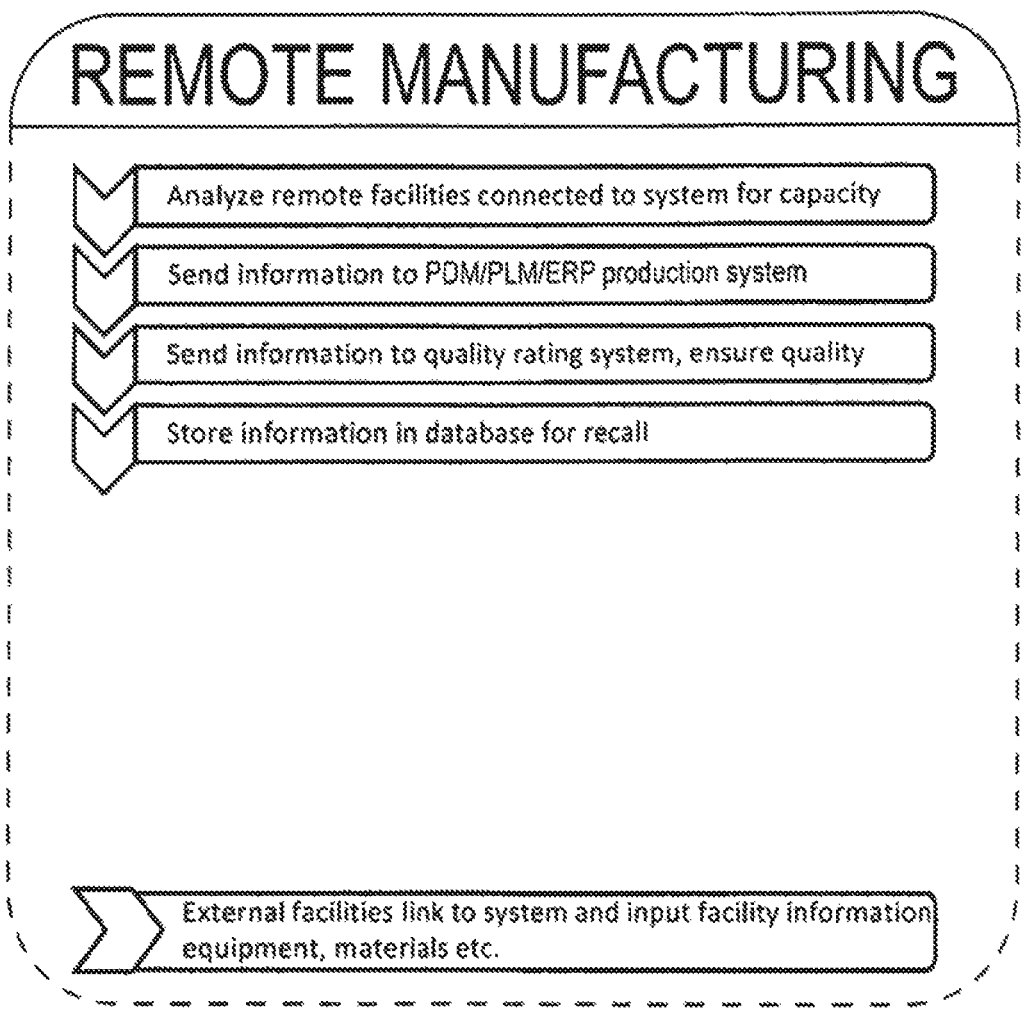

FIG. 5L illustrates an embodiment of a method for using a distributed manufacturing system.

Figure 5M:
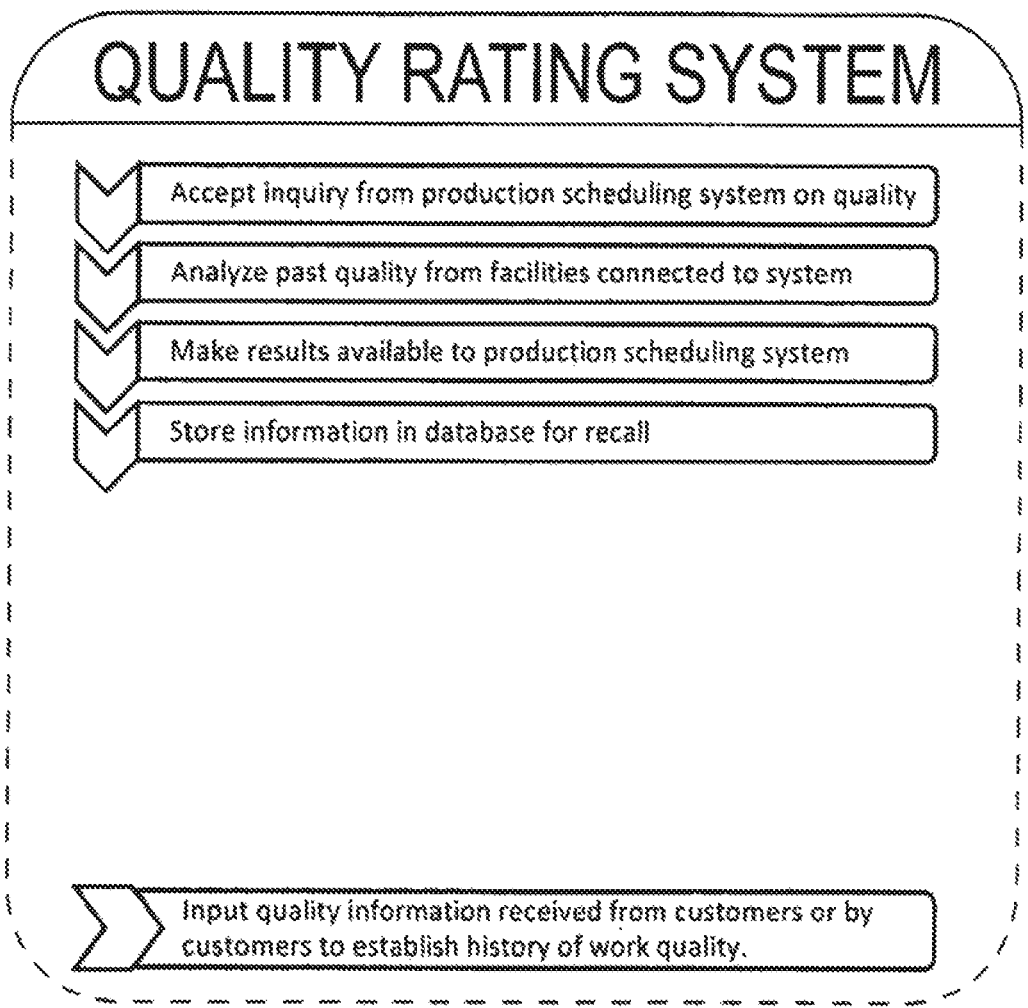

FIG. 5M illustrates an embodiment of a method for using a quality rating system for a distributed manufacturing system.

Figure 6:
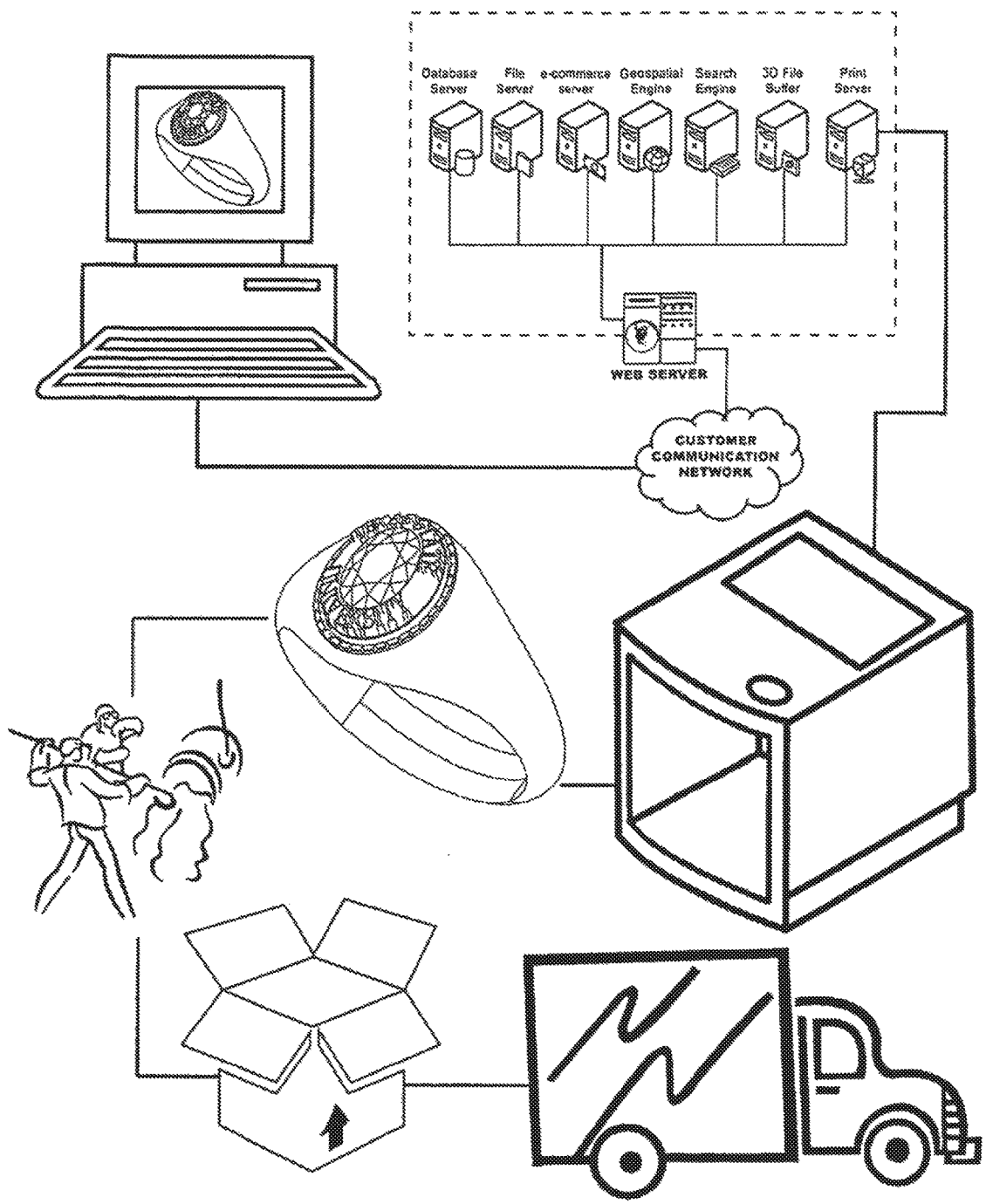

FIG. 6 is a flowchart depicting the use of the preferred embodiment of the present invention whereby the system in this example depicts the manufacture, by manifestation, of a wax pattern for a custom class ring, designed through the present invention by a user/customer.

Figure 7:
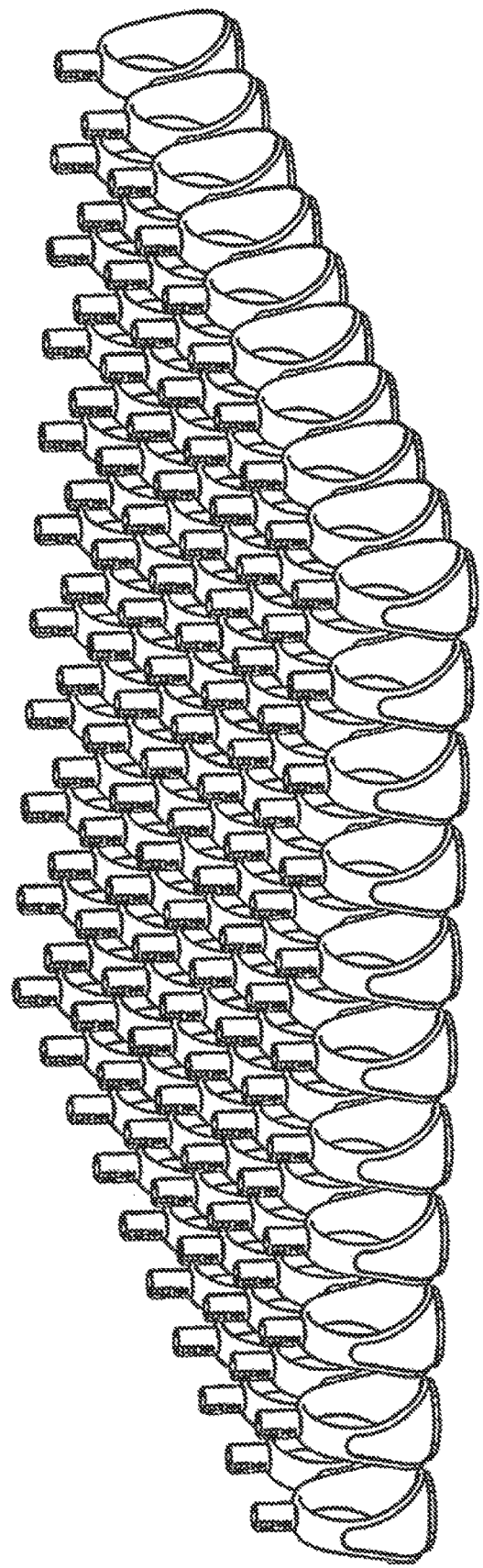

FIG. 7 illustrates a lot or "tray" of digitally routed and nested individual orders ready to be manifested via Additive Fabrication methodology including a sprue containing information to identify aspects of each unique product.

Figure 8:
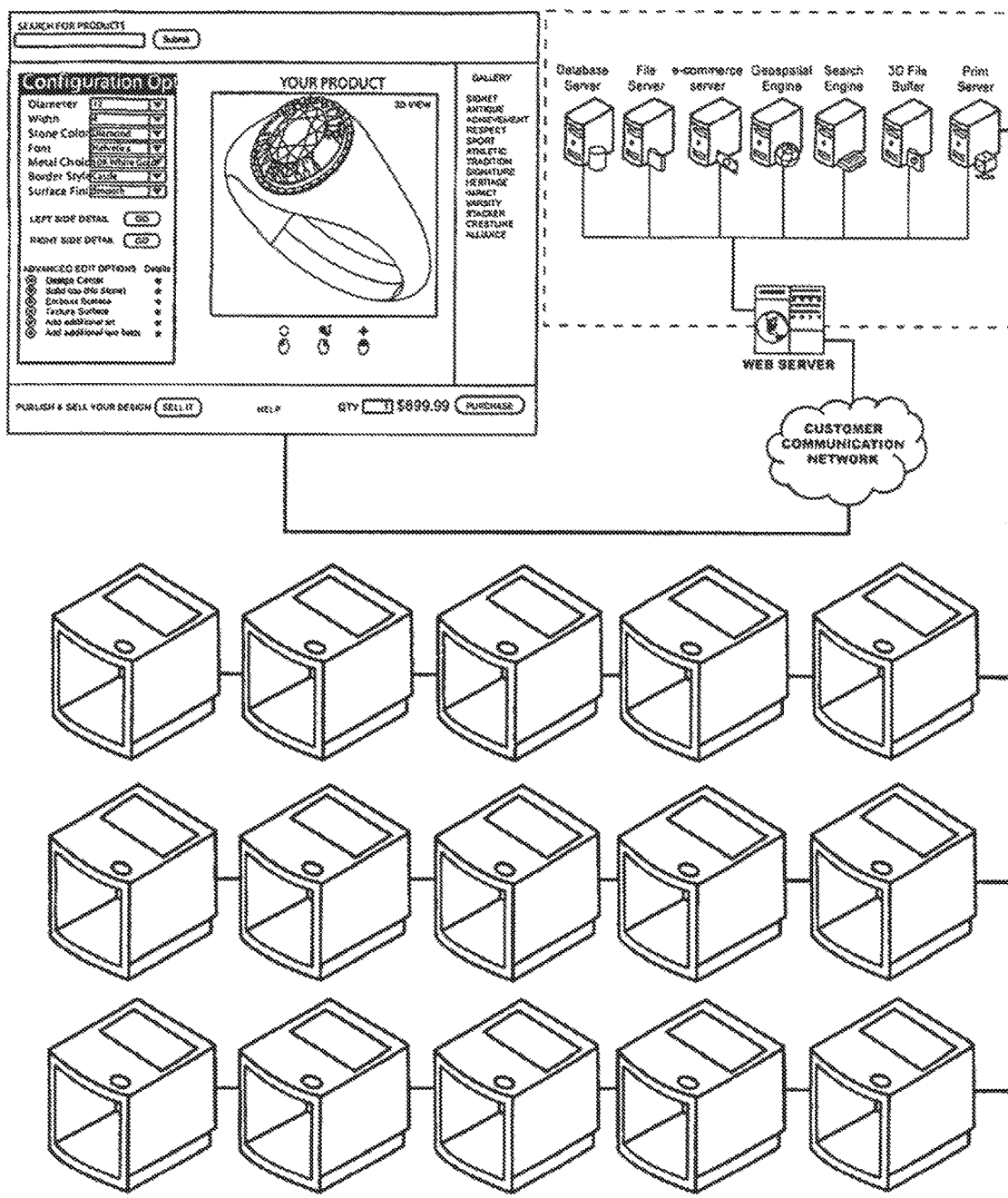

FIG. 8 illustrates process flow of the method in a preferred embodiment, representing the scalability of the system by adding additional additive fabrication machines.

FIG. 9 depicts an embodiment of a website or web portal for using a local or remote CAD system containing tools for defining product interactions, and limits on configuration and user/customer inaction, hereafter referred to as constraints.

Figure 10:
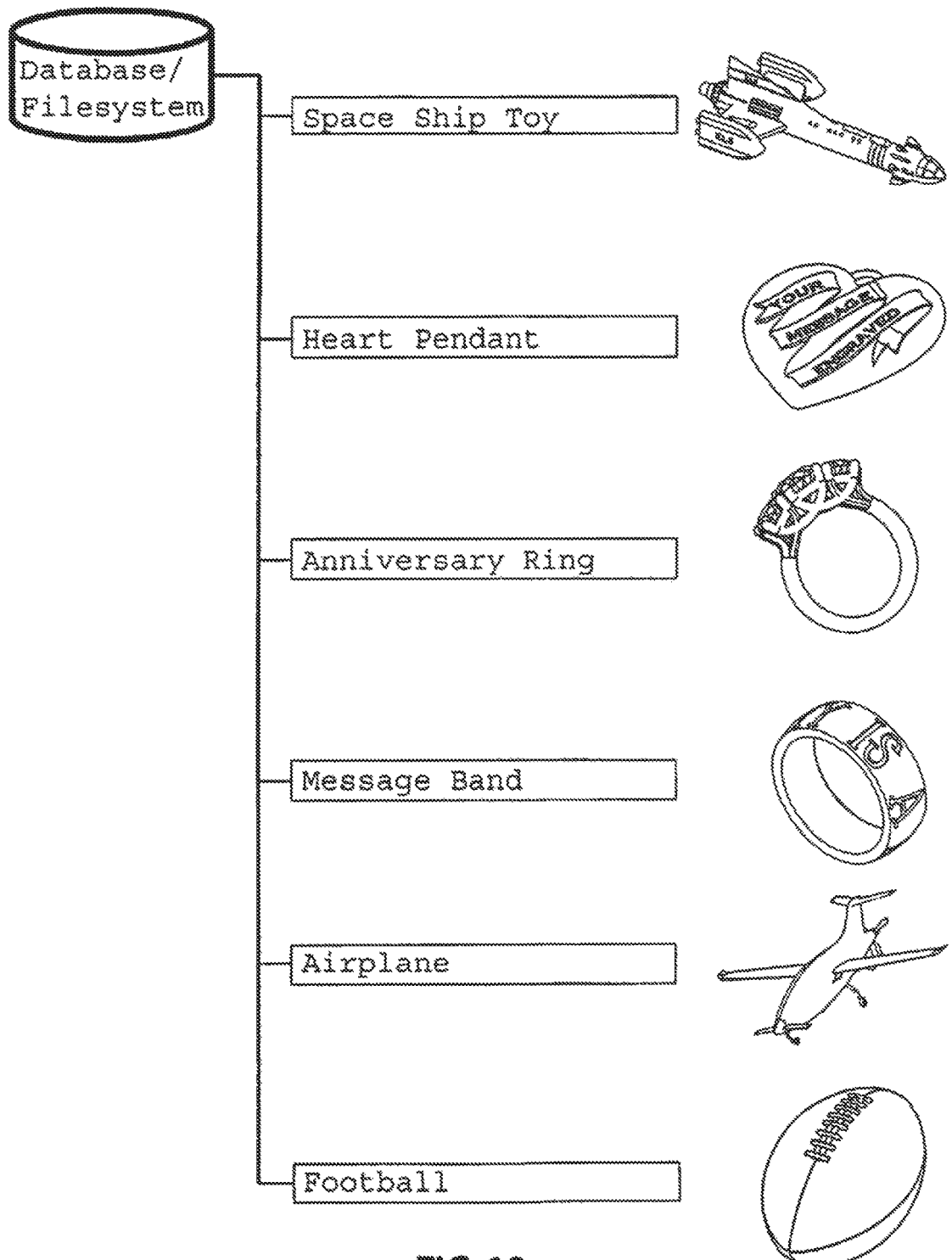

FIG. 10 depicts a diagrammatic view of an embodiment of a database or file system containing a plurality of individual products.

Figure 11:
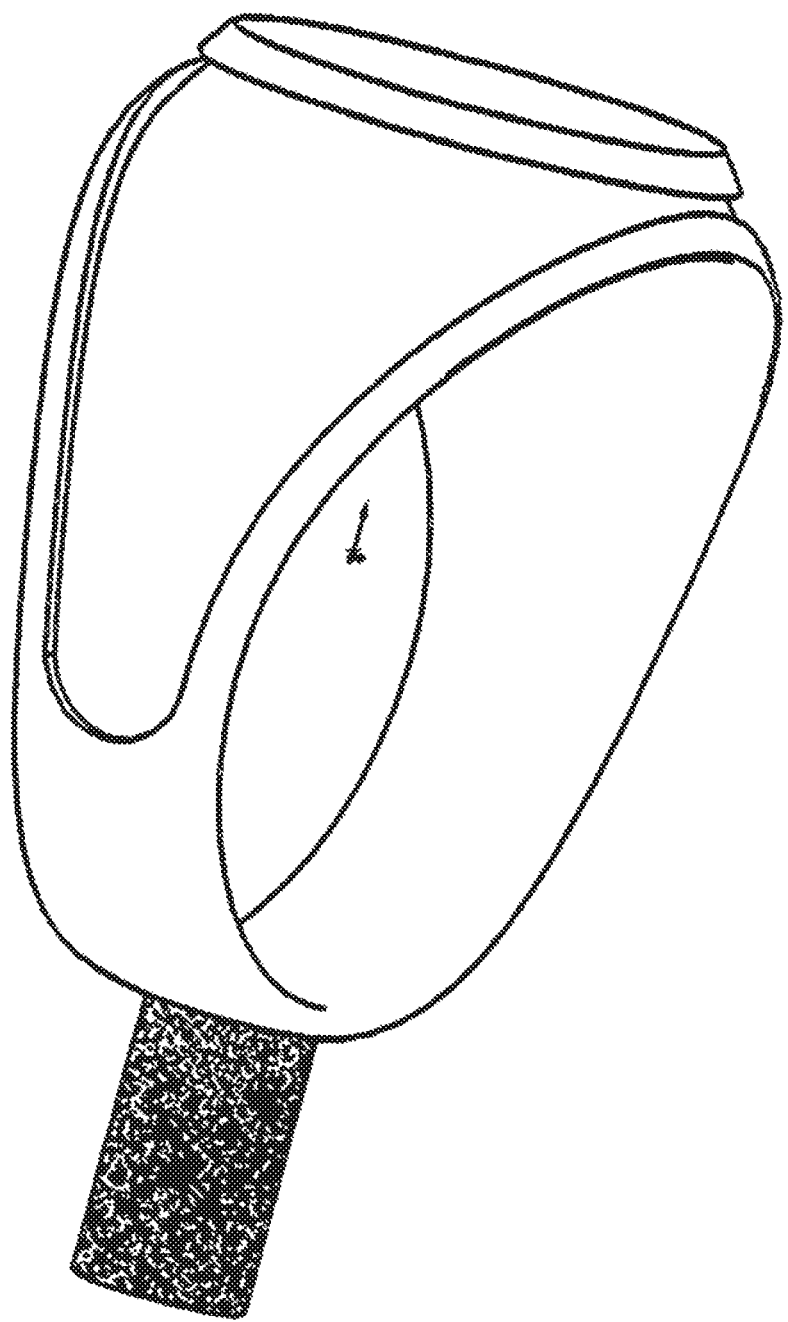

FIG. 11 depicts a product core with a suppressed feature, shown as a sprue.

Figure 12:
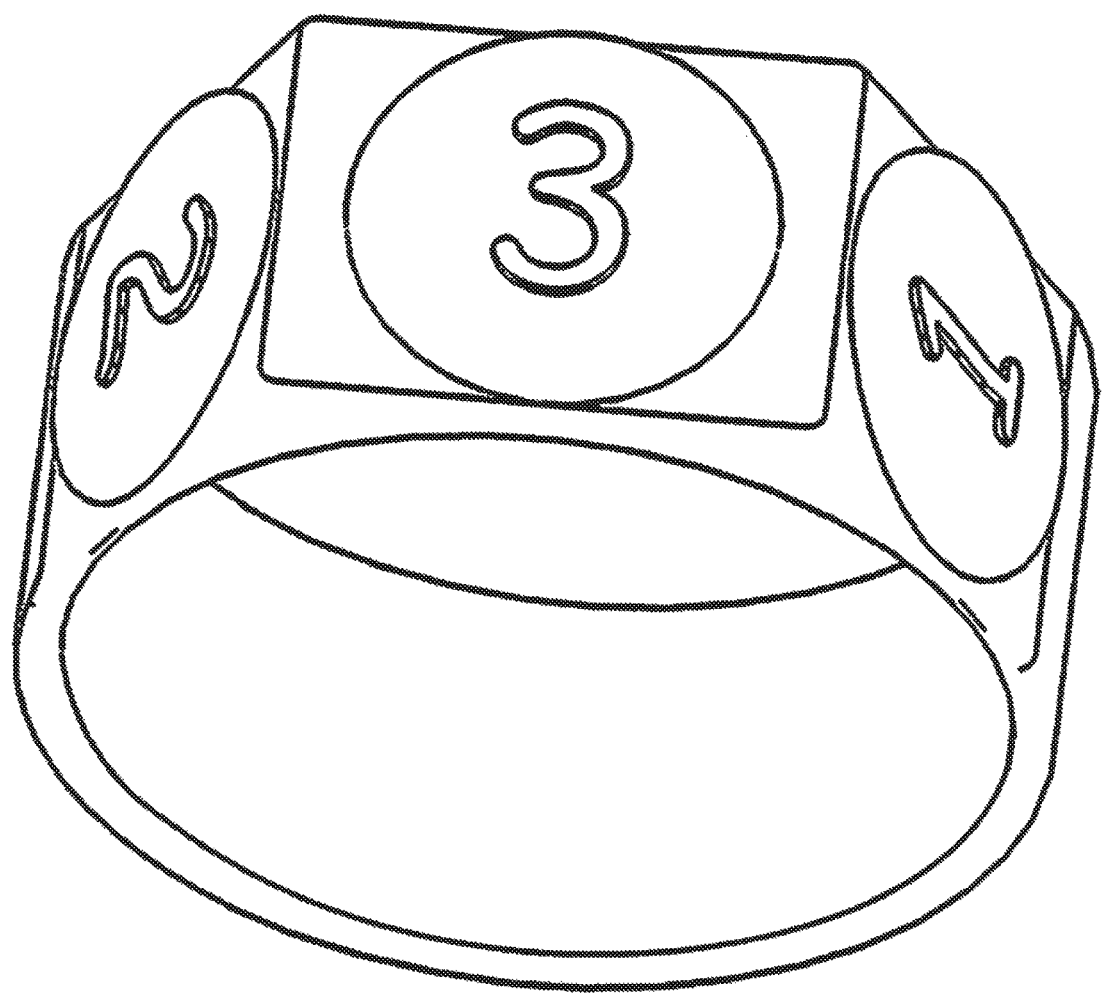

FIG. 12 depicts a product core having modification regions, usable to add 3D art and/or other mating parts to the product by the 3D CAD engine.

Figure 13:
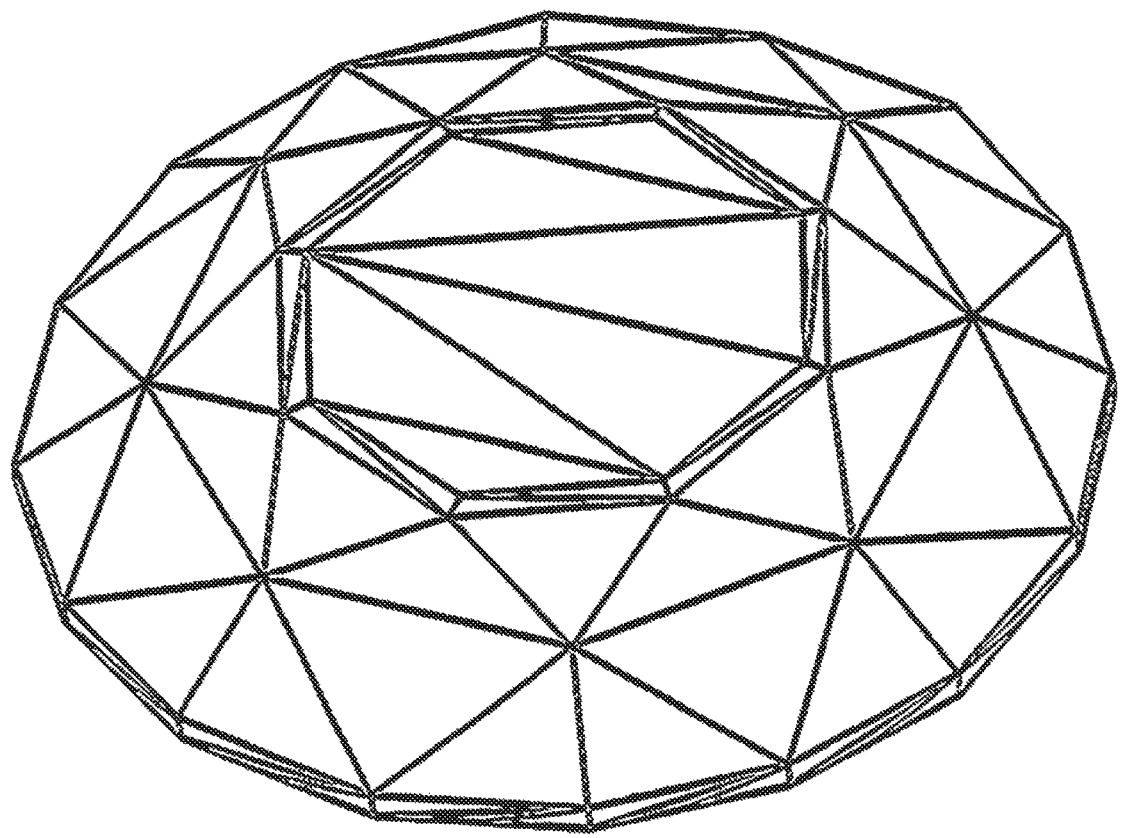

FIG. 13 depicts a 3D model for representative purposes, showing a stone for addition to a top or bezel of a customized ring.

Figure 14:
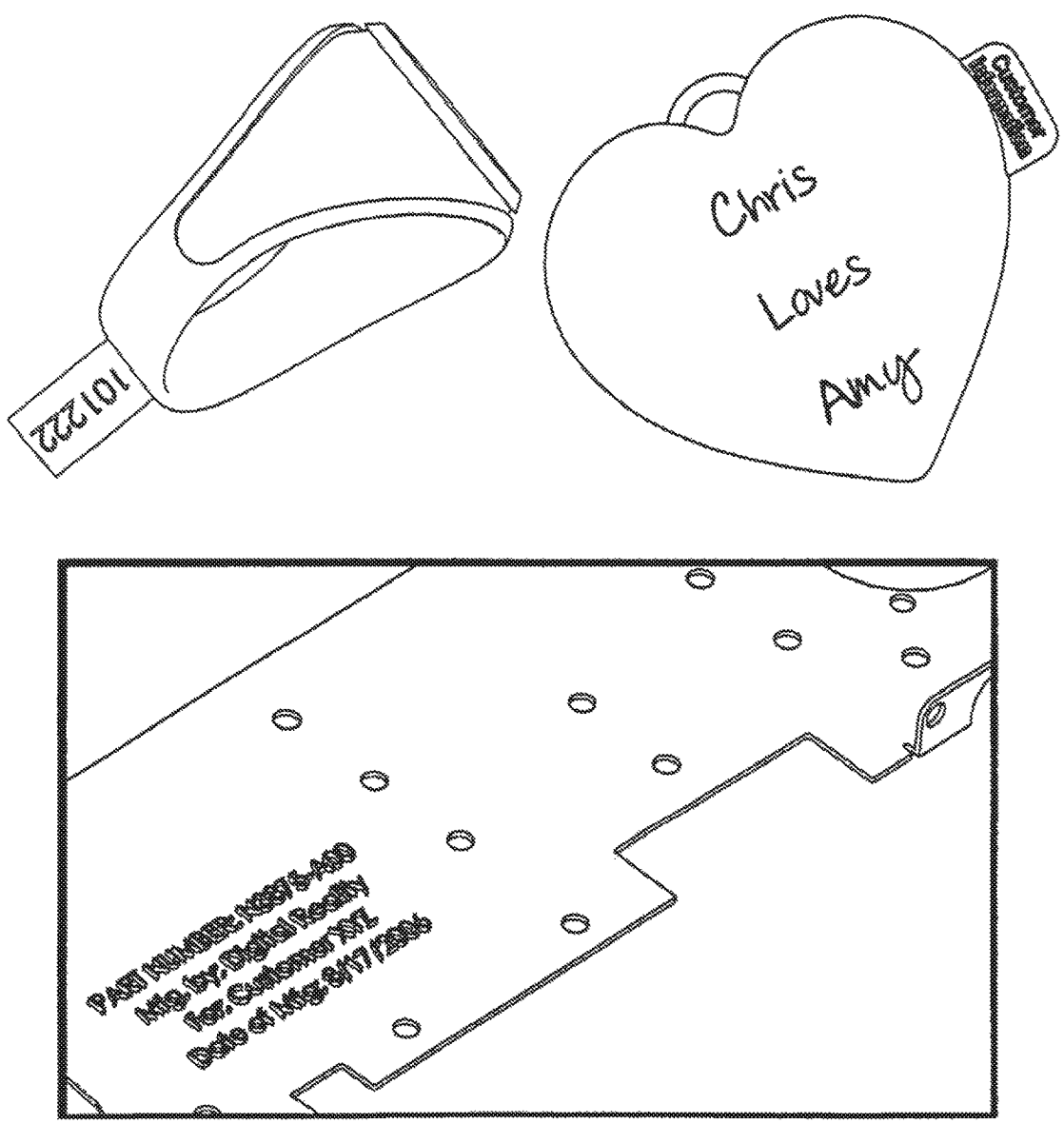

FIG. 14 depicts various modification regions or "panels" of a product showing two-dimensional and three-dimensional text added to the regions by a 3D CAD engine.

Figure 15:
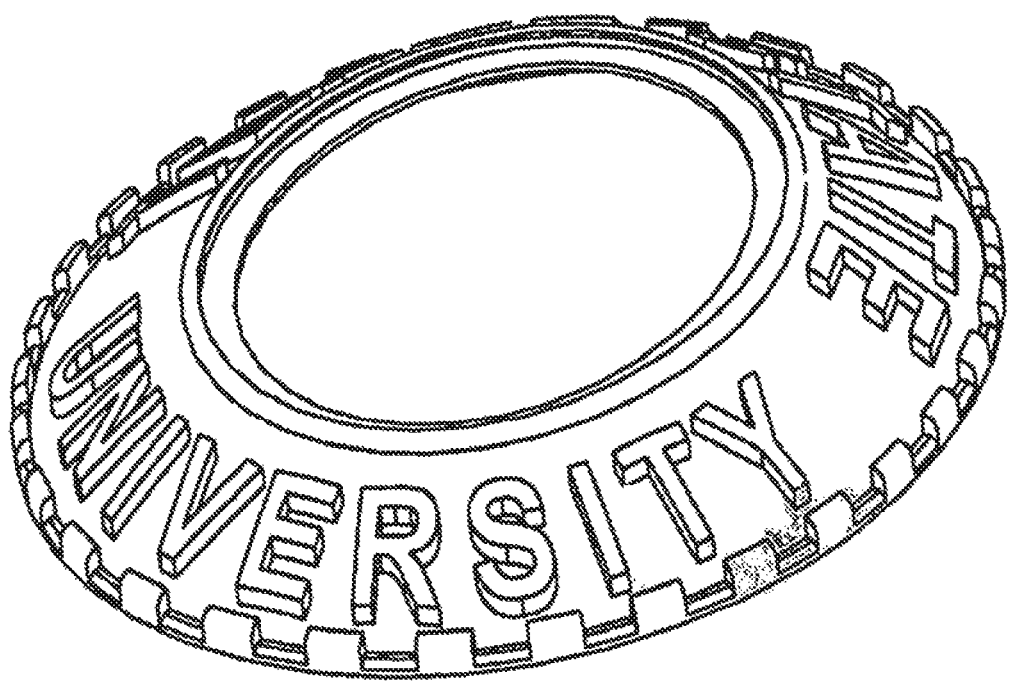

FIG. 15 depicts a 3D model for representative purposes, showing a top or bezel of a customized ring.

Figure 16:
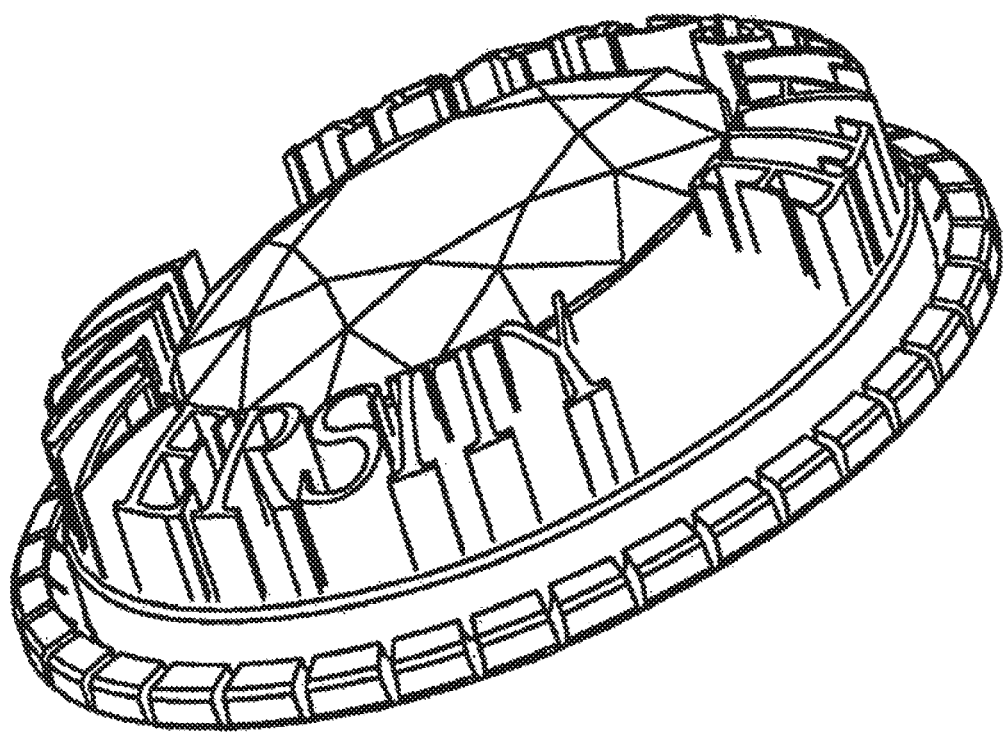

FIG. 16 depicts a stone, such as that shown in FIG. 13 mated with a bezel, such as that shown in FIG. 15.

Figure 17:
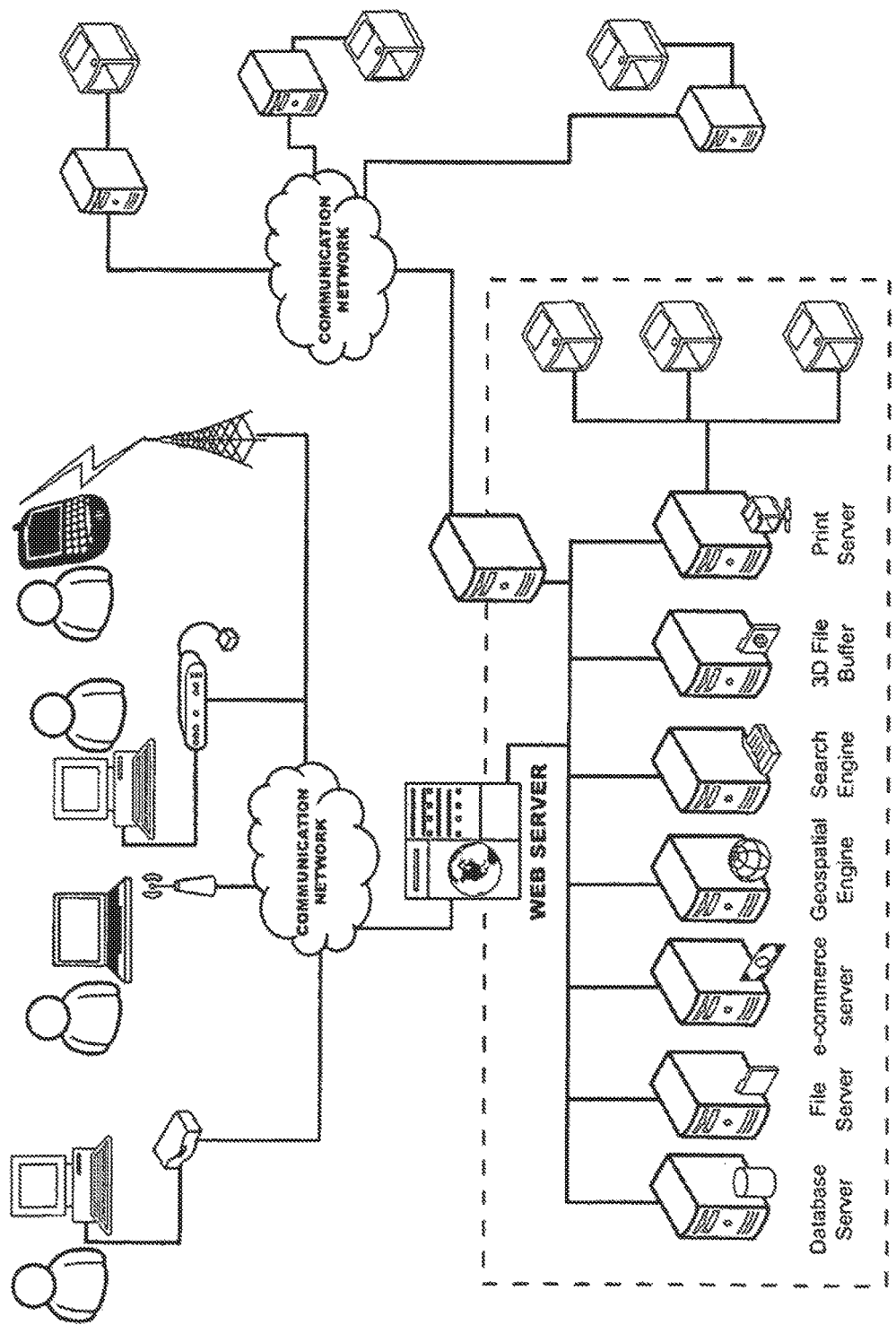
Figure 19:
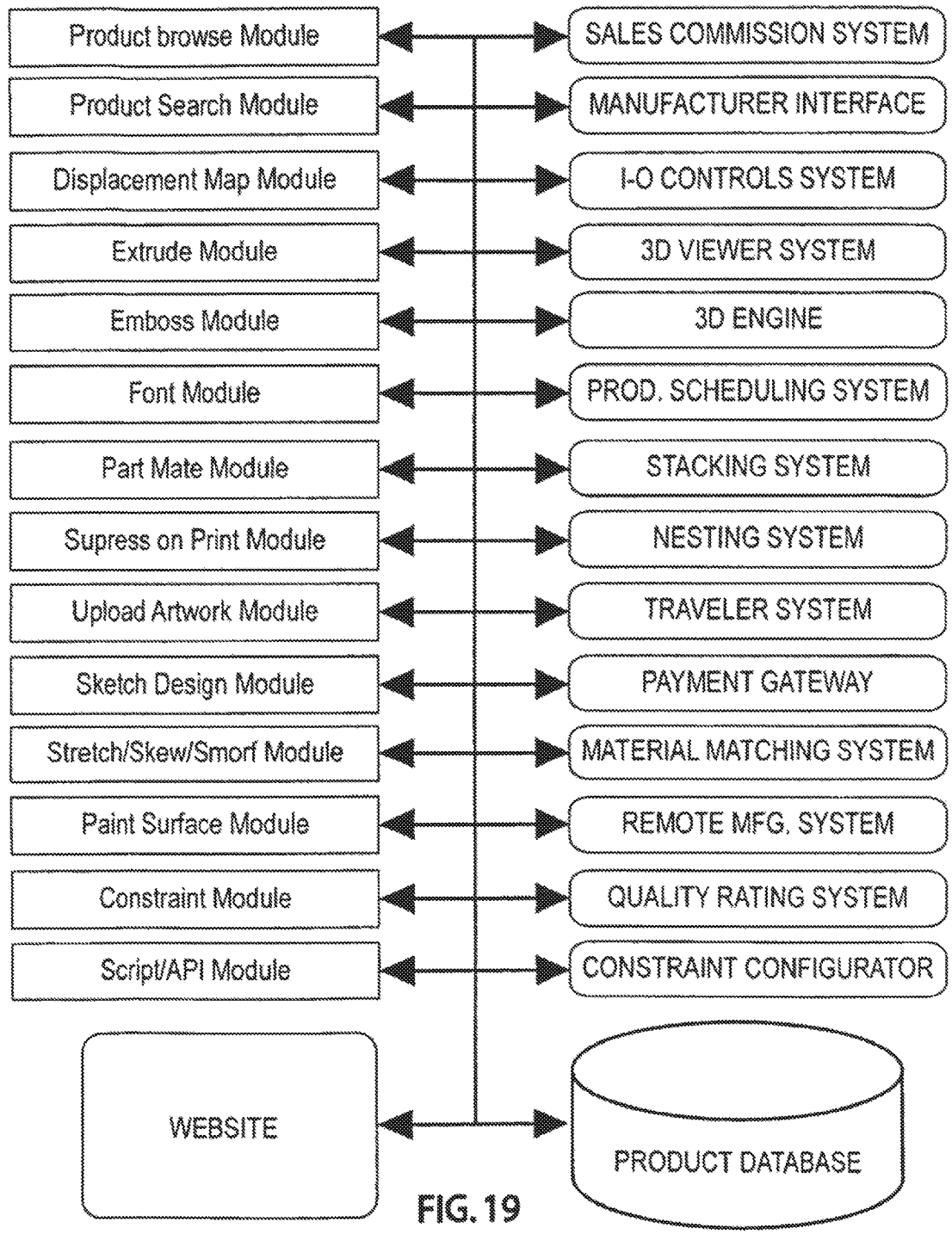

FIGS. 17 and 19 depict network diagrams of embodiments of the present system.

Figure 18:
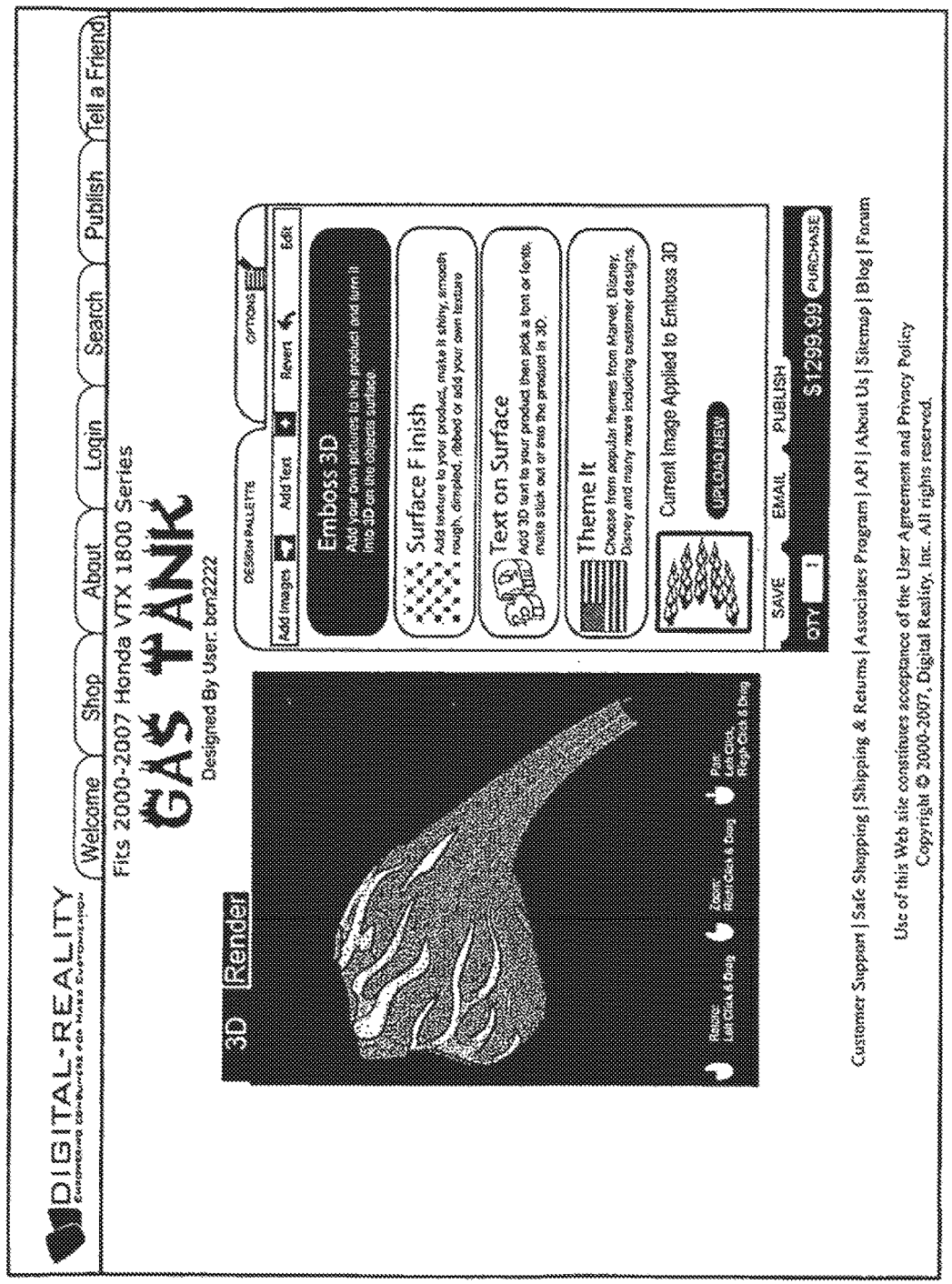

FIG. 18 illustrates a website containing an example of a user interface allowing the design of a custom motorcycle gas tank being embossed, by 3D displacement mapping, with flames.

DETAILED DESCRIPTION OF THE INVENTION AND PREFERRED EMBODIMENTS

Embodiments of the present invention will now be described in detail with reference to the associated drawings, in which preferred embodiments are shown. This invention may, however, be embodied in varying forms and should not be construed as limited to the embodiments set forth herein; rather, these embodiments are provided so that this disclosure will be complete and thorough, and will fully convey the spirit of the invention.

FIG. 1 represents a geospatial/3D geometry system, commonly referred to by someone skilled in the art as a computer aided design or geospatial design and configuration system or CAD system which for the intent of disclosure, is intended to be defined as a means to design a product which may be made available for customization/personalization within the present invention.

In one embodiment, the system deploying the method of the present invention, shall allow for the input of any geospatial/3D geometry design produced in a plurality of design software tools including but not limited to Solidworks, Inventor, Rhino, Strata-Studio Pro, Maya, CA TIA, PROE, Alias Wave Front, Alias Sketch, Lightwave 3D, DesignCAD, Enovia Amapi, Carrera 4, Hexagon, Shade 3D, Poser 6, Axel Core, Recon 3D, Anatomica 3D, Adobe Dimensions, DeICAM, Form-Z, Mechanical Desktop, Pilot 3D, Solidthinking, Unigraphics, TouchCAD, etc.

The present invention therefore can accept and utilize geospatial/3D geometry created by of the aforementioned geospatial/3D graphics application because 3D graphics applications export 3D models for cross compatibility purposes into many common 3D file formats. FIG. 1 Further represents a CAD designer or user/customer creating the desired features, including the interaction mechanisms which the consumer will be able to manipulate for the particular product(s).

FIG. 2 illustrates a website providing access to the system deploying the present invention; the example illustration reflects a website making available for sale custom jewelry. This representative website or web portal provides the link between a plurality of customers, the database(s) of product (s) available for customization, the 3D viewer system, the geospatial/3D engine system, the database system and the production system for manufacturing custom jewelry products.

It should become obvious by now that the limitations on what can be manufactured using this method and system as described herein are defined by the materials available to an additive fabrication machine and an ability to adequately define a 3D object to allow for its printing via additive fabrication means.

FIG. 3 represents the computer-based system which deploys the method of the present invention. The computer-based system runs on a computer server or computer servers utilizing an operating system. The software/hardware system is programmed to store and retrieve 3D data from a database, present it to a user/customer via the website or web portal, along with a design interface and a 3D view of the product. Said software system is also responsible for the sorting, scheduling and routing of a plurality of orders processed through the system by a plurality of users/customers. Furthermore the system is responsible for sorting, routing, nesting and scheduling said product(s) for production only after payment is received and customer approval of the 3D product visualized through the web site or web portal. The system provides for iterative design feedback prior to approval and production.

It should be obvious to anyone skilled in the art that the system could be deployed in manners which negate the need for pre-payment prior to production. For example: in delivering an order of a product to a business client who purchases on a purchase order or where no payment is required such as battlefield forward manufacturing or where the order is a repeat-order.

FIG. 4 illustrates an exemplary Additive Freeform Fabrication device. This device or a similar device is usable for the manifestation of a customer's unique product. The illustration is therefore intended to be illustrative of a 3D printer and not inclusive of all usable 3D printing equipment.

FIG. 5 is a process flow diagram illustrating one preferred embodiment of the method of the present invention. The diagram represents the interconnectivity of the various components and processes which together comprise a system and method capable of delivering an overall Made-To-Order Digital Manufacturing Enterprise System within the scope of the present disclosure.

FIG. 5A illustrates an embodiment of a method for using a website or web portal providing connectivity between a user/customer and the system deploying the method of the present invention, wherein the website or web portal provides a means for the user/customer to access the system and for the system to provide feedback to the user/customer, creating an interactive system.

As used herein, the terms "communication network" and "Internet" refer to any networking method that provides a user/customer access to the system described herein from a remote geographical location. The communication network providing two-way data communication between the user/customer accessing a website or web portal located on the World Wide Web which interfaces with said system.

As commonly understood by someone skilled in the art of the internet or e-commerce, a website or web portal refers to one or more web pages that collectively comprise a website, the website being accessible over a communication network from remote geographical locations and transferring data including but not limited to HTML, Java, or any other computer-based data, to and from a user and or user computer from one or more remote computer systems. Said website containing, for example; images, HTML, CGI, JAVA, FLASH, AXAX, ACTIVE X CONTROLS, VIDEO and other computer code to present a useful tool to a user/customer visiting the website. Said data representing content intended for a user/customer to view, interpret, and utilize for a purpose as understood commonly by anyone skilled in accessing and using the internet or World Wide Web.

In one embodiment, the website provides by the current invention includes multiple web pages, collectively comprising a website, with a home page whose meaning is clear to anyone skilled in the art of the internet and e-commerce. The website is accessible by a web browser in response to a user/customer http request resulting in the presentation of the website through its URL by which all web pages are categorized, organized and located on the internet.

A user/customer as described herein can include any person who accesses a website on the internet for the purpose of gathering information, learning, experiencing or purchasing by e-commerce. This description is extended to users who may be involved in collaborative design efforts. The terms described here are provided to represent, rather than limit, the terms describing a user/customer.

The website or web portal depicted in FIG. 5A is designed to provide users desiring to customize for the intent of purchase, personalized or customized products including any product which may be adequately represented by 3D geometry so as to allow 3D printing via Additive Fabrication methods. The website further contains one or methods to browse and or search for products contained in said system to customize or personalize and purchase. Said website or web portal further provides the means by which the user may access the system that provides the user an interface through which they may personalize or customize aspects of a product including but not limited to; color, shape, texture, function, thermal, mechanical, electrical properties, location of appendages or other 3D geometries affixed to a core product, including text, fonts, scale or other parameters of text which may be manipulated whereby said Text becomes manifested as 3D geometry or 2D geometry on the surface of a 3D geometry wherein the ability to see such 2D geometry is meant to include any means which differentiates it from the surrounding material to make it legible including but limited to color or texture.

Product manipulation and design parameters are intended to mean any modification which is feasible via geospatial/3D design modifications to a 3D object which does not violate its fit, form or function. Furthermore; product manipulation and modifications refer to any design detail or modification that augment or enhance the original product to meet an individual or personal need or desire.

Individual or personal enhancements may also include user/customer original design modifications by someone skilled in the art of 3D design and design implementation so as to create undefined enhancements to a product or an entirely new product design having the same purpose or an entirely new purpose.

The website or web portal of FIG. 5A includes the ability to include rendering geospatial/3D models to a user/customer allowing the customer to see the closest approximation of the actual physical product that is superior to all other visualization methods because the 3D entity they visualize is in fact the digital representation of their actual product.

A computer or computers deploying the method and system of the invention may include any computer system as commonly understood by anyone familiar with the common definition of a computer including computer systems with processor(s), temporary & permanent storage mediums, input/output controls, network connectivity and an operating system. Furthermore, said computer(s) contain programming code in any known explicit or implicit method whereby the code described is responsible for, solely, or in combination with hardware, causing the computer(s) to carry out operations to provide the method of the present invention described herein. Said software and or hardware clearly understood to carry out the purpose as defined to anyone skilled in the art of computers and networking.

A distinction is made between a computer or computers carrying out systems and methods usable within the scope of the present invention and a user/customer computer, whereby a user/customer accesses the computer or computers carrying out, by way of computer software and hardware, the methods of the present invention. A user/customer computer can include a PC, Smartphone, home computer, desktop computer, notebook computer, tablet PC or combination thereof.

To further explain the method and system, detailed description is provided for the remaining diagrams and drawings:

FIG. 5B illustrates an embodiment of a method for using a local or remote software or software and hardware-based system providing the set of relational controls that provide a user/customer with interactivity, e.g. through the website or web portal to personalize or customize a product and the 3D CAD system.

FIG. 5C represents a method for using the geospaital/3D viewer system that is responsible for rendering 3D geometry to a user/customer or plurality of users/customers, through the web portal, and hereafter referred to as a 3D viewer. The 3D viewer provides a user/customer, using the system through a website or web portal, with a means to visualize their product and the resulting changes in 3D.

FIG. 5D illustrates an embodiment of a method for using a set of databases and/or file systems which can be used to store and retrieve data during the operation of the computer system. FIG. 5D further represents one embodiment of process flow within the system.

FIG. 5E represents one or more approaches to geospatial/3D design and design implementation responsible for the accurate assembly, deformation or otherwise manipulation of the 3D mathematically-derived geospatial/3D models. The method may utilize but is not limited to the Parasolid or ACIS kernel and may also be a custom-designed 3D kernel system that better meets the needs of the invention if such a pre-made system proves to provide limitations on the systems functionality or scope. This geospatial/3D system accepts input to drive the accurate assembly, deformation or otherwise manipulation of 3D files at the instruction or input of a user/customer such through the design interface accessed through the website or web portal. Furthermore the 3D kernel system may, in one embodiment also be responsible for any post-processing necessary to put the 3D files in the necessary file format required for production.

FIG. 5F illustrates an embodiment of a method for using the portion o the system responsible for Product Data management, Product Life style management, and/or master production scheduling, whereby products represented by 3D model(s) are, by the system, automatically sorted, scheduled and routed as a plurality of individualized or custom-designed products, to a location where the resultant 3D geometry can be manifested via additive fabrication through the system and method described herein.

The system represented in FIG. 5F also provides for automatically sorting, scheduling and routing the plurality of individualized or custom-designed products to a locally available or remotely located Additive Fabrication machine, machines or bureaus.

According to presently understood operations of a manufacturing product lifecycle, product data management, master production scheduling, part routing system described in FIG. 5F shall, in one embodiment, be further capable of conducting intelligent or semi-intelligent decisions on how to best organize individual orders for timely production and delivery to a customer or customers including but not limited to the physical location of the bureau and or the customer.

Furthermore; according to commonly understood terminology used in manufacturing, the system illustrated in FIG. 5F shall be considered to include an automated production scheduling system responsible for automatic or semi-automatic routing and production queuing of the geospatial/3D models hereafter called products, being moved through the system.

FIG. 5G illustrates, according to widely accepted and understood meanings of the word nesting as used in manufacturing, a method or methods to automatically add 3D product(s)s to a single file representing a "batch build" on available Additive Fabrication machine connected to said system.

FIG. 5H illustrates an embodiment of a method for partial nesting that can include 2d and 3D nesting of products in an intelligent or semi-intelligent method, whereby decisions are made by the system to optimize the utilization of the build envelope of a 3D printing additive fabrication machine.

FIG. 5I illustrates an embodiment of a method for the addition of identification markings on a product represented by 3D geometry which are added as a 3D appendage, placard, tab, or directly to a surface of a part or product to convey information, which can be carried digitally, about said part or product into human or machine readable form including information about the part, the date of manufacture, customer information or other pertinent information. The method can be carried out by one or more approaches to 3D geometry manipulation metholodigies, the location and content being defined by either a user or customer or automatically by the system, and the geometry being manifested, along with the geometry representing a user/customer product via one or more additive fabrication methodologies at the time of production of the user/customer product at one or more locations.

FIG. 5J illustrates a method for using a payment processing system as part of an e-commerce system. The payment system is responsible for approving orders, based on payments prior to producing products through the system.

FIG. 5K illustrates a method for using a system to intelligently determine what material and therefore what additive fabrication machine is best suited to produce the particular part or product.

FIG. 5L illustrates one preferred embodiment of a method for facilitating the distributed manufacturing of products processed through the system, including remote locations where additive fabricate on equipment resides, such as bureaus. The system may include intelligence to help the system determine how best to distribute the products for manufacturing including, for example, the relative distance from the bureau to the customer's address.

FIG. 5M illustrates one preferred embodiment of a method for facilitating the decision to use a distributed manufacturing location, such as a bureau, by analyzing parameters of the bureaus which may include a subjective rating system to discern the reputation of the facility for producing quality work and/or producing quality work in a timely manner. The system may include many parameters by which a facility, connected to the system, is chosen or not chosen to produce a product for a user/customer through the system.

FIG. 5A through 5M represent collectively, a flowchart depicting the spirit of the present invention and the preferred embodiment thereof such that the system carries out the automated product and processing of customer-designed, customized or personalized products manufactured by additive fabrication.

FIG. 6 represents a flowchart depicting a use scenario for automated production as described above in the manufacture of custom jewelry.

FIG. 7 depicts a nested tray of assorted unique custom products, complete with identification markings affixed to the sprue of the product by the system in an automated fashion. The nested tray depicted is thereby ready for production either locally or remotely. In this case, the products are custom jewelry.

FIG. 8 illustrates one embodiment of the present invention as a commercial product entitled "Digital Factory". The system is a scalable, self contained product integrating all of the various components of the system described, for the purpose of developing, producing and making for sale products to users/customers through the automation of the system, thereby providing a system with productivity advantage, pre-purchase visualization advantage, operational advantage, inventory advantage, order accuracy advantage, and labor productivity advantage.

FIG. 9 depicts an example web portal for accessing the system. The depicted web portal is usable for the custom design of a jewelry product, whereby the customer drives the selection and assembly of the product with chosen options and includes the ability to use the design interface presented to the user/customer to add pictures which are converted to 3D geometry through methods including but not limited to displacement mapping. The interface can also enable the customer to see the resultant of the customization/personalization.

FIG. 10 depicts a database and/or file system containing a plurality of individual products, each depicting a different set of 3D geometry or art. In this representation, the database enables selection of art panels that each are either rigid in design or contain editable parameters such as text or art and can themselves be interchangeable with each other. The products in the database can include any product which is capable of being adequately defined by 3D modeling in which an additive fabrication machine may print said geometry.

FIG. 11 represents a product core with a suppressed feature, in this case a sprue on a class ring. The sprue can be a necessary part of a casting operation. However, the appendage in this case is not an object that the consumer would wish to visualize during the design process. Therefore, the feature may be suppressed so as not to be visible to the user/customer as defined by the entity who devised said product for sale through said system.

FIG. 12 depicts a product core to which art can be attached by the CAD system in response to a customer's request, and to which a "top" or "bezel" can be mated, in this case, to form a class ring. Attaching multiple parts to define a product is within the scope of definable parameters they system may allow users/customers to modify on a product or products.

FIG. 13 depicts a 3D model for representative purposes, showing a stone for addition to a top or bezel of a customized ring. There may be many stones and bezels to choose from in designing a unique product. Each stone or bezel may contain editable features including text, art or other geometry. Editing sub-level fields of each object is applicable to a plethora of products to define their unique characteristics for an individualized or customized order.

FIG. 14 depicts various modification regions or "panels" of a product showing two-dimensional and three-dimensional text added to the regions by a 3D CAD engine.

FIG. 15 depicts a 3D model for representative purposes showing a top or bezel for mating with a stone of a customized ring. While the bezel will often contain editable features, the stone is a part that is often a suppressed feature in the manufacturing operation of additive fabrication since stones may be real or synthetic in nature. However, the stone in this example is an object that would be used for representative visualization of a finalized class ring containing the stone and bezel.

FIG. 16 depicts a stone, such as that shown in FIG. 13 mated with a bezel, such as that shown in FIG. 15. This geometry would be used for visualization by a consumer using the web portal so that the consumer may accurately portray the 3D representation of the final product. Such a feature would be suppressed if necessary, such as in the case of a class ring, by removing its geometry from the overall geometry before the product is manifested via Additive Freeform Fabrication.

FIGS. 17 and 19 illustrate network diagrams of embodiments of the present invention, wherein the illustrations depicts how a user, using a computer of varying forms including a PC, a notebook, or a smart phone or other device can connect to the system of the present invention through a router, a wireless access point, a modem or a wireless network such as a CDMA network. The illustrations of various connectivity methods are intended to be illustrative instead of restrictive in nature. The connectivity methods described thus far allow a plurality of users/customers to access the system through a communication network and connect to a web server. The web server is shown connected to a plurality of servers including a database server, a file server, an e-commerce server, a content management server, a directory server, an FTP server, a print server, and a proxy server with or without a firewall. Said servers are shown collectively connected to a local array of 3D printers. The system is also, in the embodiment presented, connected, through a network connection, to a remote array of servers, wherein each remote location contains 3D additive fabrication hardware. The remote additive fabrication hardware may be contained in a bureau or factory or an individual's home including the home of someone accessing the system such that the printed product is printed in the same geographical location as the user/customer. The various servers are presented in this format to illustrate the system deploying the method and are not intended to be inclusive. Furthermore, the servers presented may be virtual or contained in a single server or servers located in the same location or distributed to multiple locations geographically. The 3D printing hardware in this illustration is strictly intended to be illustrative.

FIG. 18 illustrates a website containing an example of a user interface allowing the design of a custom motorcycle gas tank, wherein the gas tank is being embossed, by 3D displacement mapping, with flames such that the gas tank, which was originally not embossed with the 3D flames, is considered to represent a customized or personalized product. The product can be produced by additive fabrication means, directly from the 3D data after being routed through said made-to-order digital manufacturing system and said resultant product can then be finished and shipped to said customer without molds, tooling or much of the labor required in traditional methods. The product, in this case being a gas tank, can still meet all form, fit and function requirements of said product including mating surfaces and other necessary features and also convey the desired characteristics of the user/customer design session.

In the foregoing specification, embodiments of the present invention, e.g. a Made-To-Order Digital Manufacturing Enterprise System have been described as applicable to an implementation anticipating internet-based ordering or touch-panel Kiosk-based ordering of custom or made-to-order 3D products of the types outlined herein, where the special advantages of the methods and systems are very attractive for both users/customers and manufacturers. However, embodiments of the present invention may be applied to the sale and/or manufacture of many products of a homogeneous or heterogeneous nature and are limited only by the production capabilities of current or future additive fabrication methodologies and equipment, as well as the ability to adequately describe a product or products as 3D models and render such 3D objects for a user/customer so that the manipulation and controls of the system have meaning to the user or customer of the system and clearly defined manufacturability parameters. Furthermore, the preceding specification has described with reference to specific embodiments thereof. However, various modifications and changes may be made thereto without departing from the broader spirit and scope of the invention. The specifications and drawings are, accordingly, to be regarded in an illustrative sense rather than a restrictive sense.

The invention claimed is:

1. A method for generating and manufacturing a product co-designed by a first user and a second user, the product represented by a 3D CAD Model, the method comprising:

receiving, by at least one computing device, from the first user using a first user device, at least one computer file containing at least one 3D CAD Model, the at least one 3D CAD Model representing a base design for a product, uploaded to the at least one computing device;

causing, by the at least one computing device, a constraint definition interface and a representation of the at least one 3D CAD Model representing the base design for the product to be displayed on the first user device;

enabling the first user using the first user device to designate geometric modifiers, input parameters and variables defining each designated geometric modifier, each geometric modifier corresponding to functions executable to alter geometric features of the base design for the product;

receiving, by the at least one computing device, from the first user, a selection of a type of geometric modifier available in the interface and a corresponding set of variables defining at least one executable function for altering at least one geometric feature of the at least one 3D CAD Model;

linking and storing the defined features as constraints for corresponding 3D CAD Models in the system for recall;

receiving, by the at least one computing device, from a second user using a second user device, a selection of a product, the product represented by the at least one 3D CAD Model having previously designated constraint features defined in the system;

retrieving and causing to be displayed, on the second user device, a constraint application interface comprising tools, represented graphically, based on the previously defined constraints retrieved from the system, a representation of the base 3D CAD Model; enabling the second user using the second user device, to input selections of and input values for predefined constraints, executable to alter the geometry of the base 3D CAD Model representing the product;

receiving, by the at least one computing device, from the second user using the second user device, selections and values corresponding to constraint options and variables executable as geometric modifiers;

executing the geometric modifiers, based on second user input, generating a modified version of the 3D CAD Model based on the second user input, and updating the displayed 3D CAD Models on the second user device;

receiving, by the at least one computing device, from the second user using the second user device, order confirmation instructions for the current state of the modified 3D CAD Model, compiling the current state of the modified 3D CAD Model into a finalized 3D CAD Model, coupling the modified 3D CAD Model with the order confirmation information and sending the 3D CAD Model to an order aggregating data storage device;

receiving, at an order aggregating device, associated with the at least one computing device, the finalized 3D CAD Model and order confirmation instructions, storing the order confirmation information as meta-data relating the order requirements;

instructing, by the at least one computing device, the 3D printer to print the at least one 3D CAD Model representing the product in the order aggregation device; and transmitting, by the at least one computing device, the data of the tray file to the at least one respective 3D printer arranged to receive the data to do so.

2. The method of claim 1, wherein the at least one computing device further comprises an executable Product Data Management System (PDM), an Executable Product Lifecycle Management (PLM), co-design computing instructions and workflow computing instructions adapted to perform a method comprising:

linking, associating and storing, by the at least one computing device, the received 3D CAD Model(s) in the Executable PLM and product data corresponding to the product represented by the 3D CAD Model in the Executable PLM;

enabling constraint configuration, at the first user device, by the first user by transmitting, by the at least one computing device, to the first user device, data enabling the display of a constraint definition interface comprising tools, represented graphically, based on the available 3D CAD Kernel functions configured in the system and a representation of the first received base 3D CAD Model such that configuring the constraints and saving of the constraint data associates all constraint features unique to each 3D CAD Model received by the system;

receiving, by the at least one computing device, from the first user, using the first user device, definitions for a plurality of constraint features and variables, having and corresponding to geometric modifiers, the modifiers corresponding to executable functions to alter geometric features for the base 3D CAD Model previously received by the system and storing each constraint in the system the in a manner associating each with the base 3D CAD Model first received by the system thereby linking the constraints to the model;

receiving, by the at least one computing device, from the second user, a selection of a product having constraints previously configured in the system and having at least one linked 3D CAD Model representing the product stored in the system;

retrieving, by the at least one computing device, previously stored constraint features and generating a user-specific copy of the 3D CAD Models corresponding to the base product design stored in the system and selected for manipulation by the second user;

enabling geometric manipulation, at the second user device, by the second user by transmitting, by the at least one computing device, to the second user device, data enabling the display of a constraint application interface comprising tools, represented graphically, based on the previously defined constraints and a representation of the base 3D CAD Model such that interaction modifying the design results in the saving of a 3D CAD Model having all manipulations and unique to each first user and second user;

receiving, by the at least one computing device, from the second user, using the user device, selections and values corresponding to variables for the geometric modifiers, modifying the 3D CAD Model based on the user input, and updating the displayed design representation on the second user device;

receiving, processing and storing, by the at least one computing device, order confirmation instructions for the current state of the modified 3D CAD Model, compiling the current state of the modified 3D CAD Model into a finalized 3D CAD Model, in a manner coupling the modified 3D CAD Model with the order confirmation information and sending the 3D CAD Model to an order aggregating data storage device;

receiving the finalized 3D CAD Model in the order aggregating device and storing the same as an order represented by the finalized 3D CAD Model and data linking the 3D CAD Model and order information;

enabling the system having computing instructions configured to process orders for each 3D CAD Model having order confirmation instructions, treating each unique 3D CAD Model itself as the object being ordered, scheduled and produced;

instructing, by the at least one computing device, the 3D printer to print the 3D CAD Models representing products in the order aggregation device; and transmitting, by the at least one computing device, the data of an aggregated tray file to the at least one respective 3D printer arranged to receive the data to do so.

3. The method of claim 1, further comprising;

receiving a designation of the at least one 3D CAD Model as a primary file representing a core of the product co-designed by the first user and the second user;

receiving, associating and storing, by the at least one computing device, from the first user, at least one additional 3D CAD Model, and a designation of the at least one additional 3D CAD model as a secondary 3D CAD Model file of the product represented by the primary file and the at least one additional 3D CAD Model generally referred to as an assembly;

causing, by the at least one computing device, a constraint definition interface and representation of the base and secondary files received to be displayed on the first user device, enabling the first user to input parameters and variables defining constraint features for the primary and secondary files utilizing a part made module within the constraint definition interface;

receiving, associating and storing, by the at least one computing device, a plurality of constraint features and variables, corresponding to geometric modifiers, designated for their respective primary and secondary files in the assembly of the product including, but not limited to, a spatial location or orientation for the at least one secondary file relative to the primary file;

receiving, by the at least one computing device, from the second user using the second user device, a selection of the product, the product represented by the primary and secondary 3D CAD Model files collectively comprising the product, having previously designated constraint features respectively defined for each model in the system, retrieving and causing to be displayed, on the second user device, a constraint application interface comprising tools, represented graphically, based on the previously defined constraints retrieved from the system, a representation of the base and secondary files received to be displayed, enabling the second user, at the user device, to input selections of and input values for predefined constraints, executable to alter the geometry of each respective primary and secondary file representing the product;

receiving, from the second user using the second user device, selections and values using the provided constraint application interface corresponding to constraint options and variables executable as geometric modifiers, executing the geometric modifiers, based on second user input, generating a modified version of the primary and secondary files based on the second user input, and updating the displayed primary and secondary files on the second user device;

receiving, by the at least one computing device, from the second user, using user device, order confirmation instructions for the current state of the 3D CAD Models, compiling the current state of the modified 3D CAD Models into a finalized 3D CAD Model, coupling the modified 3D CAD Models with the order confirmation information and sending the 3D CAD Model to an order aggregating data storage device;

receiving, at an order aggregating device, associated with the at least one computing device, the finalized 3D CAD Model and order confirmation instructions, storing the order confirmation information as meta-data relating the order requirements;

enabling the at least one computing device to determine, production related determination for producing the 3D CAD Models including location, capacity and quality of 3D printers and facilities having the printers indexed in the system;

instructing, by the at least one computing device, the 3D printer to print the 3D CAD Models representing products in the order aggregation device; and transmitting, by the at least one computing device, the data of the aggregated tray file to the at least one respective 3D printer arranged to receive the data to do so.

4. The method of claim 1, wherein the at least one computing device contains computing instructions adapted to apply production scheduling, routing, stacking, nesting and batching based on available capacity, quality rating and geographical location of facilities and 3D printers indexed in the system wherein;

the system is configured to treat the 3D CAD Model files as the object being production scheduled, indexed, aggregated, organized, nested, stacked and manufactured; and the at least one computing device contains computer instructions to provide the functionality adapting the system for additive manufacturing.

5. The method of claim 1, wherein the at least one computing device is additionally configured to perform the method through an Application Programming Interface (API), wherein the API comprises a set of subroutine definitions, protocols, and tools executable by at least two computing devices when retrieved from a non-transitory storage device, enabling the at least two computing devices to collaboratively enable the method, wherein the API enables a second computing device to be communicatively coupled to the first computing device to perform one or more operations of the method, and wherein, a cluster of computers comprises at least one of a database server, a file server, an e-commerce server, a geospatial engine, a search engine, a 3D file buffer, a print server, and a web server.

6. The method of claim 1, wherein the product is selected from the group consisting of class rings, toys, tools, aircraft parts, motorcycle parts, medical implants, automotive parts, helmets and hardhats, pulleys and drive equipment, belt buckles, computer housings, handgun and rifle parts, shoe inserts, jewelry products, picture frames, decorative products, medallions, coins and plaques.

7. The method of claim 1, wherein at least one of the geometric modifiers corresponds to a ring size selected using a ring sizing geometry manipulation tool.

8. The method of claim 1, further comprising:
providing a virtual part suppress-on-print function to display a gemstone in the 3D CAD Model, useful for visualization purposes, and designating the gemstone as not to be compiled into the finalized 3D CAD Model being sent to the order aggregation device.

9. The method of claim 1, wherein the at least one computing device, coupled to the at least one 3D printer is configured to perform a method, comprising:

receiving, by the at least one computing device, from the first user using the first user device, the computer file containing the at least one 3D CAD Model, the 3D CAD Model representing the base design for the product;

causing, by the at least one computing device, a traveler definition interface and a representation of the 3D CAD Model representing the base design for the product to be displayed on the first user device, enabling the first user at the first user device to input parameters and variables defining a digital traveler feature;

receiving, by the at least one computing device, from the first user using the first user device, a designation of a geometry type selection, a location or orientation defining the traveler geometry position relative to each 3D Model and instructions defining the information to be converted into geometry by downstream processing, associating and storing the information as a traveler feature in the system;

instructing, by the at least one computing device, a 3D CAD Kernel to generate geometry for the traveler feature, the instructing accomplished by parsing, by the at least one computing device the designated and stored traveler feature parameters required to be converted to geometry and converting the requirements into 3D geometry, updating the 3D CAD Model in the order aggregation device to include the modified traveler geometry and compiling the same into a finalized 3D CAD Model representative of the product ordered now containing the traveler geometry and providing the order and the 3D CAD Model corresponding to the order for downstream processing.

10. The method of claim 1, further comprising:
aggregating, by the at least one computing device, a plurality of orders for products, at least one of the plurality of orders represented by the 3D CAD Model;
sorting, by the at least one computing device, a subset of the plurality of orders into a group of orders based in part on a type of a 3D printer printing material specified for use in the subset of the plurality of orders;
arranging, by the at least one computing device, a plurality of 3D CAD Models for products in the group of orders into an aggregated tray file associated with the type of the 3D printer printing material;
instructing, by the at least one computing device, the 3D printer to print the plurality of 3D CAD Models for the products in the group in the 3D printer printing material based in part on the data in the aggregated tray file; and
transmitting, by the at least one computing device, over a communication network the data of the tray file to the at least one respective 3D printer arranged to receive the data to do so;
wherein:
the method enables co-design between the first user and the second user;
the co-design method enables geometric alterations to base 3D CAD Model files between the first and the second user;
the method provides means to embed the co-design method by adapting an e-commerce system to facilitate co-design of 3D CAD Model files;
the method facilitates order aggregation, sorting, batching, nesting, stacking and production scheduling or a plurality of 3D CAD Model files co-designed between the first user and the second user;
the method facilitates, by computing instructions, combining and adapting production scheduling, e-commerce and PLM/PDM/ERP systems to perform the method directly using 3D CAD Model files.

11. A system, comprising:
at least one 3D printer;
at least one computing device communicatively coupled to the at least one 3D printer, the computing device configured to perform a method comprising:
aggregating, by the at least one computing device, a plurality of orders for products, at least one of the plurality of orders represented by a 3D CAD Model corresponding to at least one of the plurality of orders;
sorting, by the at least one computing device, a subset of the plurality of orders into a group of orders based in part on a type of a 3D printer printing material specified for use in the subset of the plurality of orders;
arranging, by the at least one computing device, a plurality of 3D CAD Models for products in the group of orders into an aggregated tray file associated with the type of the 3D printer printing material;
instructing, by the at least one computing device, the 3D printer to print the plurality of 3D CAD Models for the products in the group in the 3D printer printing material based in part on the data in the aggregated tray file;
transmitting, by the at least one computing device, over a communication network the data of the aggregated tray file to the at least one respective 3D printer arranged to receive the data to do so; and wherein the computing instructions are performed by the at least one computing device adapted to process 3D CAD Model files.

12. The system of claim 11, wherein the at least one computing device is configured to perform an aggregating method, the aggregating method comprising;
receiving, at an order aggregating device, associated with the at least one computing device, order confirmation instructions for a product and at least one 3D CAD Model representative of and corresponding to the product;
linking and storing, by the at least one computing device, order confirmation instructions and the at least one 3D CAD Model representative of and corresponding to the product ordered, wherein the order aggregating device comprises at least one computing device having a non-transitory data storage device arranged to receive and store the 3D CAD Model and order confirmation instructions (OCI).

13. The system of claim 11, wherein the at least one computing device is configured to perform a method comprising:
receiving, by the at least one computing device, from a first user, data defining 3D printer printing materials for at least one 3D printer, the material selections made available for selection by a second user, wherein the data input for 3D printer printing materials enables the at least one computing device to organize a subset of the plurality of orders into a group of orders at least in part based on a type of a 3D printer printing material specified for use in the subset of the plurality of orders.

14. The system of claim 11, wherein the products, represented by the 3D CAD Model files are received by the system for order aggregation from an e-commerce system adapted for and configured to enable co-design of the 3D CAD Models; and wherein products are selected from the group consisting of class rings, toys, tools, aircraft parts, motorcycle parts, medical implants, automotive parts, helmets and hardhats, pulleys and drive equipment, belt buckles, computer housings, handgun and rifle parts, shoe inserts, jewelry products, picture frames, decorative products, medallions, coins and plaques stored as 3D CAD Model files accessible by users accessing the system.

15. The system of claim 11, wherein the at least one computing device is configured as a production scheduler treating each 3D CAD Model corresponding to a plurality of orders for products as the object being production scheduled, batched and produced by being communicatively coupled to at least one remotely located 3D printer configured to receive 3D CAD Models and corresponding order confirmation instructions, and wherein the at least one computing device is configured to perform a distributed manufacturing method comprising;
receiving, by the at least one computing device, data regarding objective reputation characterization for previous orders from a user having previously utilized the system for at least one order for a product represented by a 3D CAD Model, the receiving enabled by providing the user an opportunity to input the reputation data after receipt of the product;
generating, by the at least one computing device, a Distributed Manufacturers Score (DMS) for each manufacturer based on previous orders, the DMS score representing the level of satisfaction in doing business with a particular remotely located 3D printer bureau arranged to receive 3D CAD models from the system;

determining and selecting, by the at least one computing device, at least one indexed remote 3D printer meeting at least the material requirements and a DMS score threshold for the at least one order in the group of orders and assigning the at least one order to at least one remotely located indexed 3D printer;

instructing, by the at least one computing device, the remote 3D printer to print the 3D CAD Models representing products in the order aggregation device; and transmitting, by the at least one computing device, the data to the at least one respective 3D printer arranged to receive the data to do so.

16. A system comprising;
at least one computing device containing computing instructions to perform the method of claim 10, the computing instructions stored on a non-transitory data storage device executable by the computing device to perform the method of claim 15, wherein the system is configured to be used by outsource providers offering commercial opportunities for enterprise mass-customization of products, represented by 3D CAD Model files and manufacturing of products therefrom to $3^{rd}$ party customers, and wherein the computing instructions enable outsource providers utilizing the system to connect and define their own 3D printers in the system.

17. A method, comprising:
aggregating, by the at least one computing device, a plurality of orders for products, at least one of the plurality of orders represented by a 3D CAD Model corresponding to the orders;

sorting, by the at least one computing device, a subset of the plurality of orders into a group of orders based in part on a type of a 3D printer printing material specified for use in the subset of the plurality of orders;

arranging, by the at least one computing device, a plurality of 3D CAD Models for products in the group of orders into an aggregated tray file associated with the type of the 3D printer printing material;

instructing, by the at least one computing device, the 3D printer to print the plurality of 3D CAD Models for the products in the group in the 3D printer printing material based in part on the data in the aggregated tray file; and transmitting, by the at least one computing device, over a communication network the data of the tray file to the at least one respective 3D printer arranged to receive the data to do so.

18. The method of claim 17, wherein the at least one computing device is configured to perform an aggregating method comprising:
receiving, at an order aggregating device associated with the at least one computing device, order confirmation instructions for a product and at least one 3D CAD Model representative of and corresponding to the product; and linking and storing, by the at least one computing device, order confirmation instructions and the at least one 3D CAD Model representative of and corresponding to the product ordered, wherein the order aggregating device comprises at least one computing device having a non-transitory data storage device arranged to receive and store the 3D CAD Models and order confirmation instructions (OCI); and containing computing instructions for manufacturing production scheduling, routing, nesting, stacking and determination of production facility and machine selections to receive the 3D CAD Model files received by the system.

19. The method of claim 18, wherein the at least one computing device is communicatively coupled to the at least one 3D printer, wherein the computing device configured as a production scheduler for 3D CAD Models corresponding to a plurality of orders for products, and wherein the at least one computing device is configured to perform a method comprising:
receiving, by the at least one computing device, a designation for each 3D printing device communicatively coupled to the at least one computing device and variables for each designated 3D printer, including 3D printer printing materials producible and the printable area for each designated 3D printer such that all 3D printers coupled to the at least one computing device and their individual capabilities become registered and indexed in the production scheduler;

receiving, at an order aggregating device associated with the at least one computing device, an aggregation of 3D CAD Models containing 3D CAD Models representing and corresponding to a product and Order Confirmation Instruction (OCI) data corresponding to each order, the OCI data including values input by the second user defining a material selection and a quantity;

sorting, by the at least one computing device, a subset of the plurality of orders into a group of orders based in part on a type of a 3D printer printing material specified for use in the subset of the plurality of orders;

selecting, by the at least one computing device, at least one indexed 3D printer meeting the material requirements for the group of orders and assigning the group of orders to at least one indexed 3D printer;

determining, by the at least one computing device, the respective capacity of the selected 3D printer based on the quantity of selected 3D CAD Models in the group of orders that fit within the 3D printer print area, such that the available print area is efficiently and completely utilized;

compiling, by the at least one computing device, data corresponding to a subset of the group of assigned 3D CAD Models that will fit within the print area of the selected 3D printer, into a single data set batch thereby arranging, by the at least one computing device, a plurality of 3D CAD Models for products in the group of orders into an aggregated tray of 3D CAD Models to maximize a production capacity and a delivery timeline for the products;

instructing, by the at least one computing device, the 3D printer to print the 3D CAD Models in the aggregated tray of 3D CAD Models; and transmitting, by the at least one computing device, over a communication network, the compiled data set of the aggregated tray of 3D CAD Models, to the at least one respective 3D printer arranged to receive the data to do so, the 3D printer being arranged to manufacture a physical object from the instructions within the file transmitted.

20. The method of claim 19, wherein the product is selected from the group consisting of class rings, toys, tools, aircraft parts, motorcycle parts, medical implants, automotive parts, helmets and hardhats, pulleys and drive equipment, belt buckles, computer housings, handgun and rifle parts, shoe inserts, jewelry products, picture frames, decorative products, medallions, coins and plaques.

* * * * *